United States Patent
Lee et al.

(10) Patent No.: US 11,476,342 B1
(45) Date of Patent: Oct. 18, 2022

(54) SEMICONDUCTOR DEVICE WITH IMPROVED SOURCE AND DRAIN CONTACT AREA AND METHODS OF FABRICATION THEREOF

(71) Applicant: TAIWAN SEMICONDUCTOR MANUFACTURING COMPANY, LTD., Hsinchu (TW)

(72) Inventors: Wei Ju Lee, Hsinchu (TW); Chun-Fu Cheng, Hsinchu (TW); Chung-Wei Wu, Hsinchu (TW); Zhiqiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/308,617

(22) Filed: May 5, 2021

(51) Int. Cl.
| | |
|---|---|
| *H01L 29/417* | (2006.01) |
| *H01L 27/092* | (2006.01) |
| *H01L 29/08* | (2006.01) |
| *H01L 21/8238* | (2006.01) |
| *H01L 21/285* | (2006.01) |
| *H01L 29/45* | (2006.01) |

(52) U.S. Cl.
CPC .. *H01L 29/41791* (2013.01); *H01L 21/28518* (2013.01); *H01L 21/823814* (2013.01); *H01L 21/823821* (2013.01); *H01L 21/823871* (2013.01); *H01L 27/0924* (2013.01); *H01L 29/0847* (2013.01); *H01L 29/45* (2013.01)

(58) Field of Classification Search
CPC ......... H01L 29/41791; H01L 21/28518; H01L 21/823814; H01L 21/823821; H01L 21/823871; H01L 27/0924; H01L 29/0847; H01L 29/45
See application file for complete search history.

(56) References Cited

U.S. PATENT DOCUMENTS

| | | | |
|---|---|---|---|
| 8,367,528 B2 * | 2/2013 | Bauer | H01L 21/02573 |
| | | | 438/149 |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |

(Continued)

*Primary Examiner* — Karen Kusumakar
*Assistant Examiner* — Adam S Bowen
(74) *Attorney, Agent, or Firm* — NZ Carr Law Office

(57) ABSTRACT

Semiconductor device includes substrate having fins, first S/D feature comprising first epitaxial layer contacting first fin, second epitaxial layer on first epitaxial layer, third epitaxial layer on second epitaxial layer, third epitaxial layer comprising center and edge portion higher than center portion, and fourth epitaxial layer on third epitaxial layer, second S/D feature adjacent first S/D feature and comprising first epitaxial layer contacting second fin, second epitaxial layer on first epitaxial layer of second S/D feature, third epitaxial layer on second epitaxial layer of second S/D feature, third epitaxial layer comprising center and edge portion higher than center portion of third epitaxial layer, center and edge portions of third epitaxial layer of first and second S/D features are merging, and fourth epitaxial layer on third epitaxial layer of second S/D feature, S/D contact covering edge and center portions of third epitaxial layers of first and second S/D features.

20 Claims, 27 Drawing Sheets

(56) References Cited

U.S. PATENT DOCUMENTS

| | | | |
|---|---|---|---|
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 * | 11/2017 | Liao | H01L 21/823431 |
| 2016/0013316 A1 * | 1/2016 | Kuang | H01L 21/02639 |
| | | | 257/190 |
| 2016/0027918 A1 * | 1/2016 | Kim | H01L 29/7848 |
| | | | 257/401 |
| 2019/0097006 A1 * | 3/2019 | Li | H01L 29/16 |
| 2020/0044025 A1 * | 2/2020 | Liu | H01L 21/76897 |

* cited by examiner

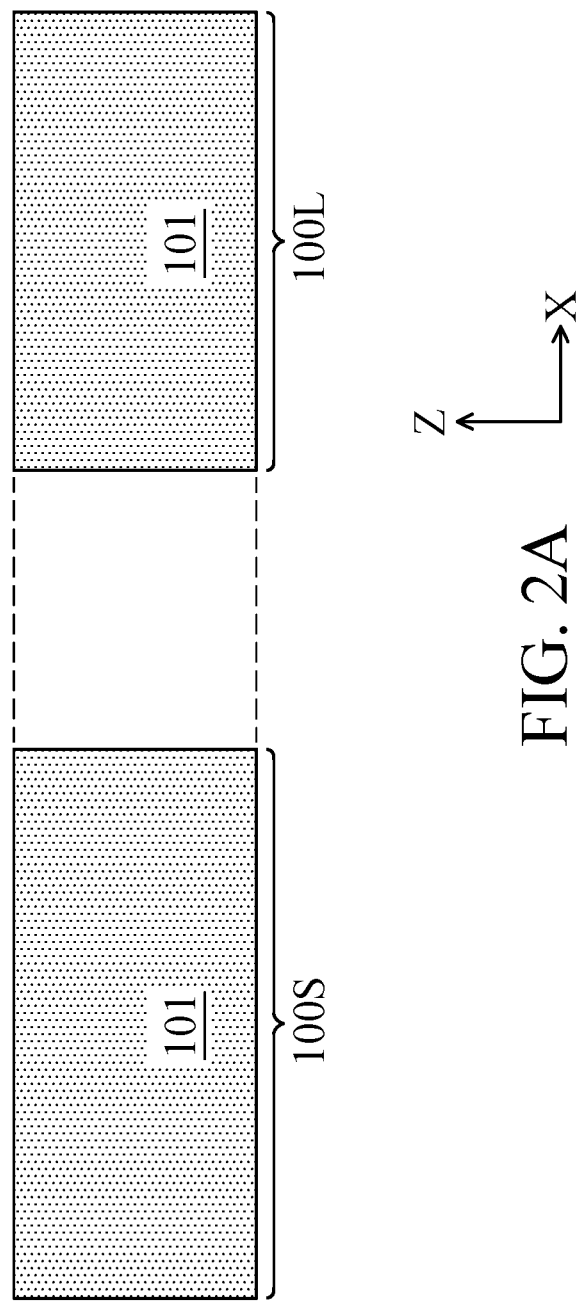

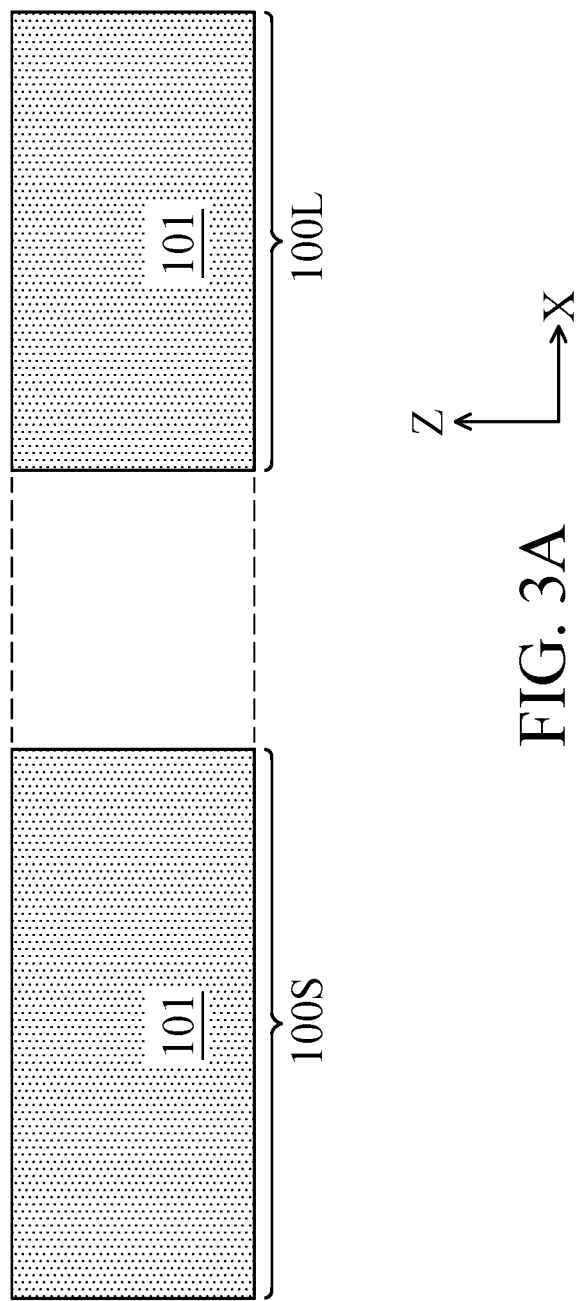

SEMICONDUCTOR DEVICE WITH IMPROVED SOURCE AND DRAIN CONTACT AREA AND METHODS OF FABRICATION THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, the critical dimension uniformity of the source and drain (S/D) contact may suffer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-11A are cross-sectional views of various stages of manufacturing a semiconductor device structure taken in a first plane in accordance with some embodiments.

FIGS. 1B-11B are cross-sectional views of various stages of manufacturing the semiconductor device structure taken in a second plane perpendicular to the first plane in accordance with some embodiments.

DETAILED DESCRIPTION

Figure 1A:
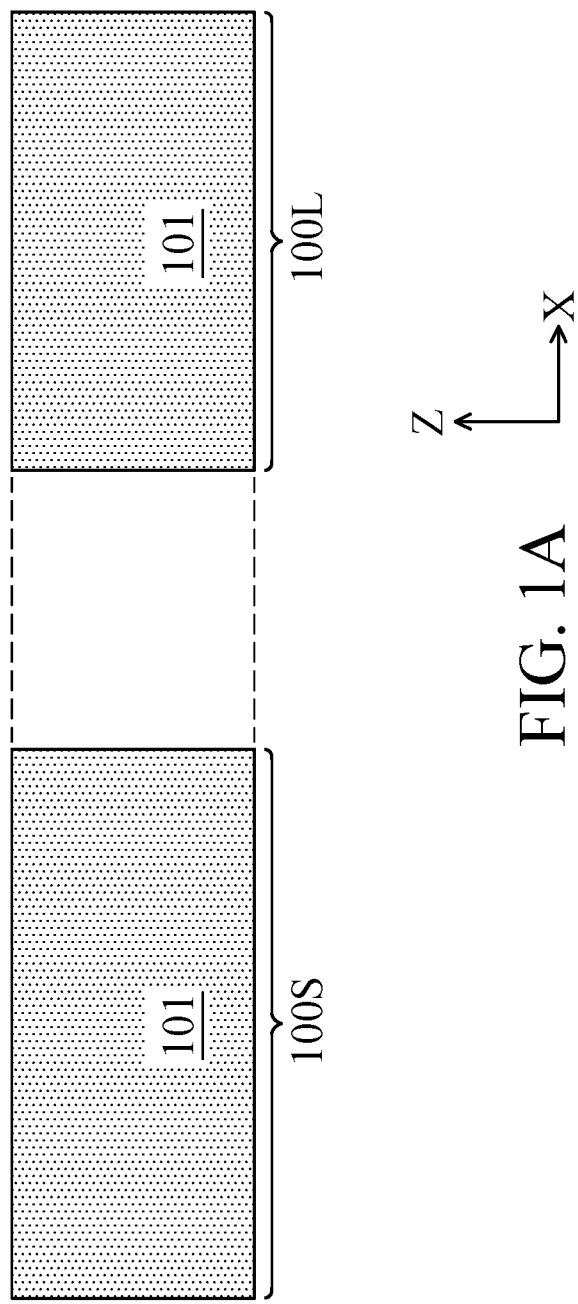

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The current technologies of forming epitaxial source/drain (S/D) features often result in different shapes and heights of epitaxial S/D features in a substrate. For example, the devices (e.g., transistors) in short channel regions or core circuit regions may have gate stacks with different gate length and a gate spacing smaller than that of the devices in the long channel regions or input/output (I/O) circuit regions, resulting in a greater raise height (i.e., height of epitaxial features above the fin top) of epitaxial features in the short channel regions or core circuit regions than a raise height of epitaxial features in long channel regions or I/O regions. According to embodiments of the present disclosure, the formation of epitaxial S/D features is controlled so that the growth rate on surfaces having (100) surface orientation is higher than the growth rate on surfaces having (110) and (111) surface orientations. Due to different growth rates on different surface planes and different gate spacing in different regions, the epitaxial S/D features in the short channel regions or core circuit regions are formed in a substantial bar-like shape while the epitaxial S/D features in the long channel regions or I/O regions are formed in a substantial diamond-like shape. Particularly, the diamond-like shape of the epitaxial S/D features in the long channel regions or I/O regions provides an increased raise height, which in turn increases the surface area of the epitaxial S/D features for a subsequent S/D contact to conduct more current. As a result, the contact resistance of epitaxial S/D features in the long channel regions or I/O regions is reduced and the device performance of the transistors is improved. Various embodiments are discussed in more detail below.

While some embodiments described in this disclosure are described in the context of FinFETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, and other suitable devices.

FIGS. 1A-11B show exemplary processes for manufacturing a semiconductor device structure 100 according to embodiments of the present disclosure. It is understood that additional operations can be provided before, during, and after processes shown by FIGS. 1A-11B, and some of the operations described below can be replaced or eliminated, for additional embodiments of the method. The order of the operations/processes is not limiting and may be interchangeable.

Figure 1B:
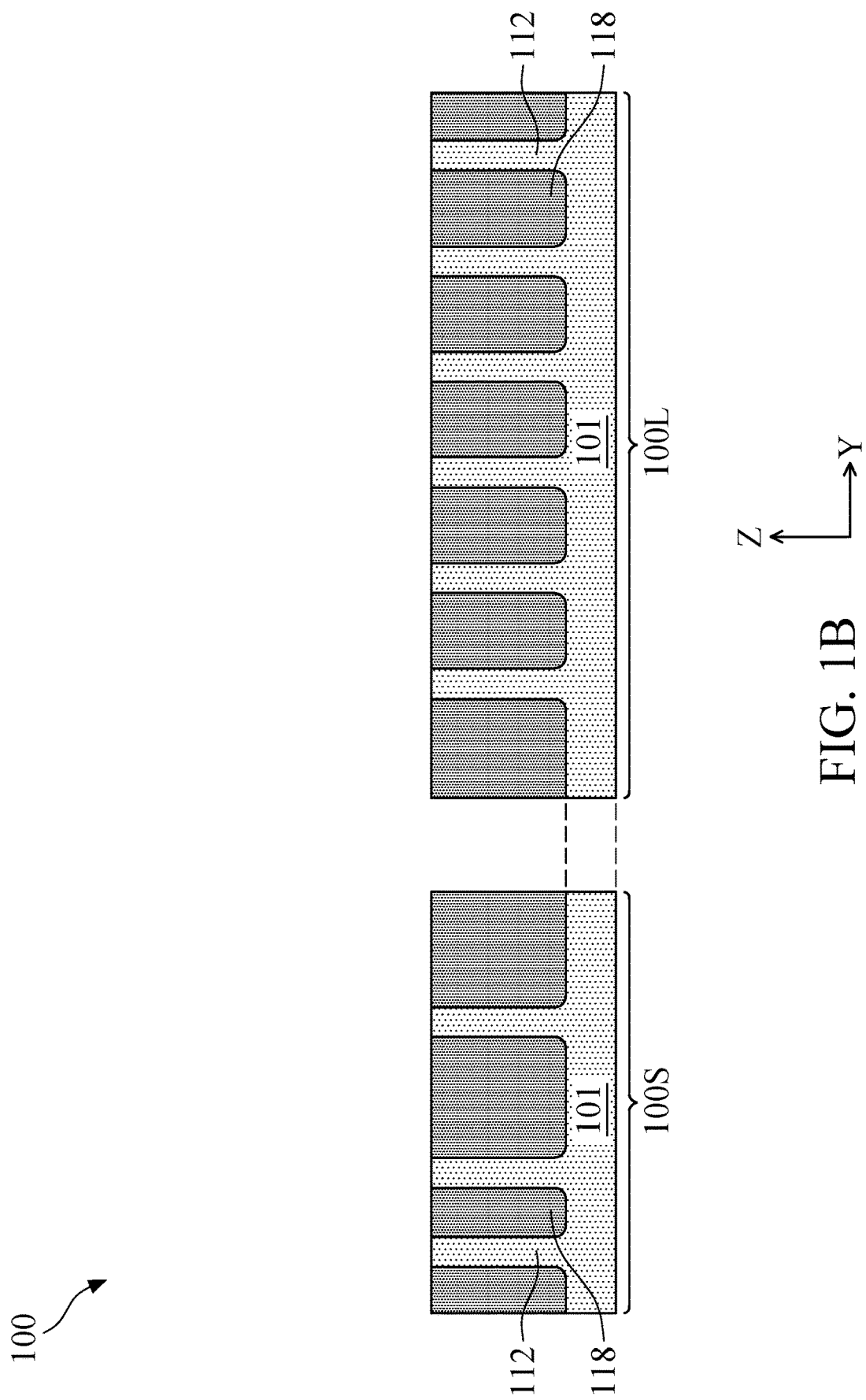

FIGS. 1A-11A are cross-sectional views of various stages of manufacturing a semiconductor device structure 100 in the Z-X plane in accordance with some embodiments. FIGS. 1B-11B are cross-sectional views of various stages of manufacturing the semiconductor device structure 100 in the Z-Y plane in accordance with some embodiments. As shown in FIGS. 1A and 1B, the semiconductor device structure 100 includes a substrate 101, which may represent a portion of a wafer. The substrate 101 includes one or more short channel regions 100S (only one is shown) and one or more long channel regions 100L (only one is shown) at respective portions of the semiconductor device structure 100. The short channel region 100S and the long channel region 100L may be separated from each other by any predetermined distance (represented by dashed lines) depending on the application. While the short channel region 100S is shown adjacent to the long channel region 100L along the X direction, the long channel region 100L may be located at different regions of the substrate 101. In one embodiment shown in FIGS. 1A-1B to 11A-11B, the short channel region 100S is designated to be a core circuit region and the long channel region 100L is designated to be an input/output (I/O) circuit region. The short channel region 100S and the long channel region 100L may be isolated by, for example, shallow trench isolation (STI) regions.

The substrate 101 may include any currently-known or later developed material capable of being processed into a transistor device. The substrate 101 may be or include a bulk crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 may be or include a composite structure, such as silicon-on-insulator (SOI) substrate having an insulating layer (e.g., oxide) disposed between two silicon layers for enhancement.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

FIG. 1B illustrates the formation of fins 112 in the short channel regions 100S and the long channel regions 100L of the substrate 101. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In one embodiment, the fins 112 may be formed by patterning a hard mask layer (not shown) formed on the substrate 101 using patterning operations including photo-lithography and etching processes. The etching process can include dry etching (e.g., reactive ion etching (ME)), wet etching, and/or a combination thereof. The substrate 101 may be etched such that trenches are formed between neighboring pairs of fins 112 in the short channel regions 100S and the long channel regions 100L. After the fins 112 are formed, an insulating material 118 is formed in the trenches so that the fins 112 in the short channel regions 100S and the long channel regions 100L are embedded in the insulating material 118. Then, a planarization operation, such as a chemical mechanical polishing (CMP) method, is performed such that the top of the fins 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 2B:
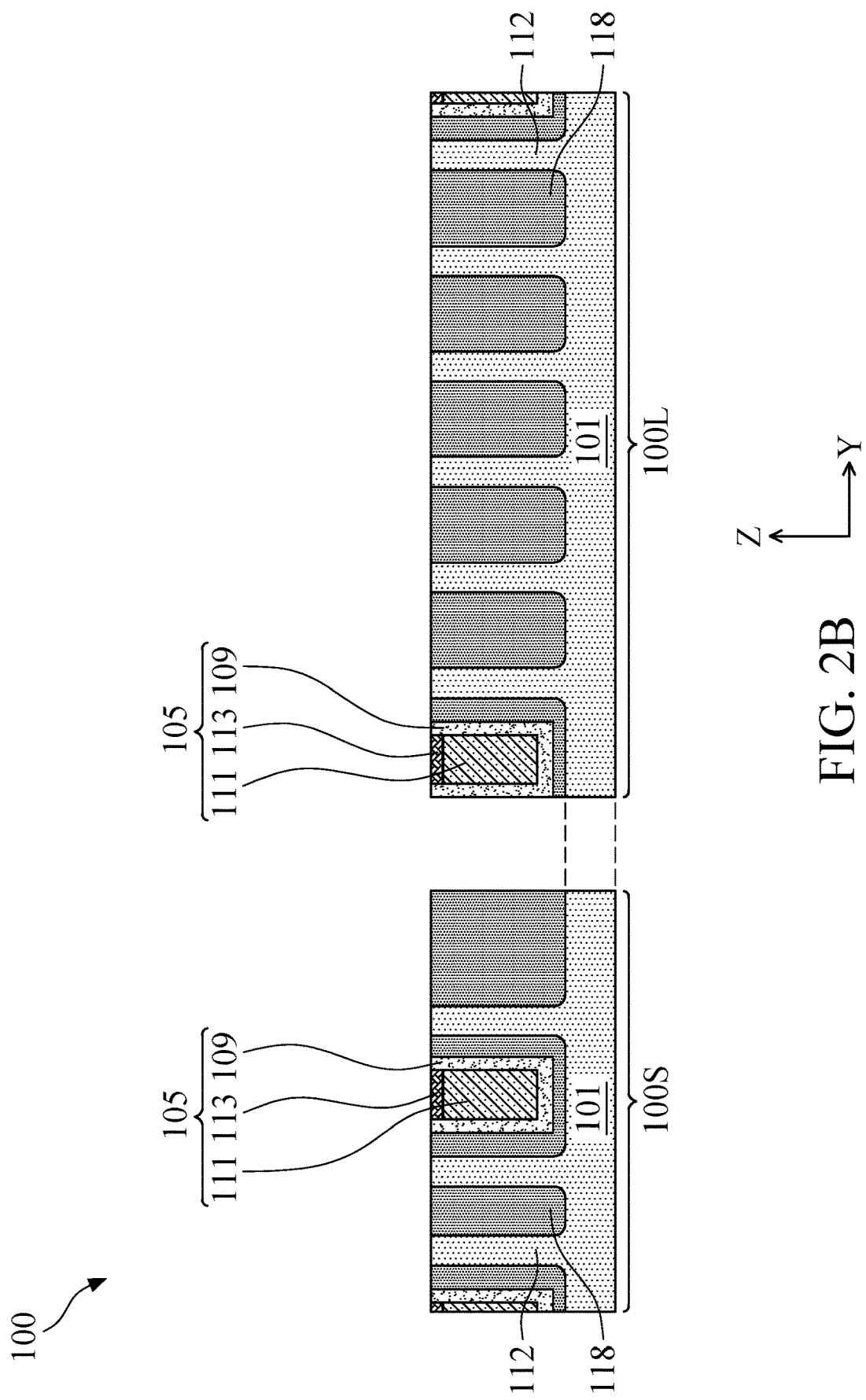

FIGS. 2A and 2B illustrate the formation of dielectric fin structures 105 in the short channel regions 100S and the long channel regions 100L of the substrate 101. The dielectric fin structures 105 are selectively deposited in the insulating material 118 between adjacent fins 112. In one embodiment shown in FIGS. 2B-11B, at least two fins 112 are disposed between adjacent dielectric fin structures 105 in the short channel region 100S and at least six fins 112 are disposed between adjacent dielectric fin structures 105 in the long channel region 100L. Since epitaxial S/D features are to be formed on the fins 112 and in contact with subsequently formed source/drain contact (e.g., S/D contacts 176 in FIGS. 11A and 11B), the number of fins 112 between adjacent dielectric fin structures 105 may vary depending on the electrical current needed in the short channel regions 100S and the long channel regions 100L. The number of fins 112 between adjacent dielectric fin structures 105 in the short channel region 100S may be less, equal, or greater than the number of fins 112 between adjacent dielectric fin structures 105 in the long channel region 100L. In some embodiments, the number of fins 112 between adjacent dielectric fin structures 105 in the short channel region 100S is less than the number of fins 112 between adjacent dielectric fin structures 105 in the long channel region 100L. For example, the number of fins 112 between adjacent dielectric fin structures 105 in the short channel region 100S may be from 1 to 6, and the number of fins 112 between adjacent dielectric fin structures 105 in the long channel region 100L may be from 3 to 20.

The dielectric fin structures 105 may include a single dielectric material or two or more dielectric materials, which may be formed of low-K dielectric materials or high-K dielectric materials. The dielectric fin structures 105 may be referred to as a hybrid fin. In one embodiment, each dielectric fin structure 105 includes a first dielectric layer 109, a second dielectric 111 formed on the first dielectric layer 109, and a third dielectric layer 113 formed on the second dielectric layer 111 and in contact with the first dielectric layer 109. The first dielectric layer 109 may include a metal oxide or a high-K material having a K value of 7 or above. In some embodiments, the first dielectric layer 109 may include $HfO_2$, $ZrO_2$, $HfAlO_x$, $HfSiO_x$, $Al_2O_3$, etc, and may be formed by any suitable deposition technique such as CVD, plasma enhanced CVD, ALD, or sputter, etc. The second dielectric layer 111 may include a low-K dielectric material (e.g., a material having a K value lower than 7). In some embodiments, the second dielectric layer 111 is a silicon-containing low-K dielectric material such as $SiO_2$, SiN, SiCN, SiOC, or SiOCN, and may be formed by any suitable deposition technique such as CVD, plasma enhanced CVD, ALD, or sputter, etc. The third dielectric layer 113 may include a dielectric material having a K value greater than that of silicon oxide. In some embodiments, the third dielectric layer 113 may include SiO, SiN, SiON, SiCN, SiOCN, $HfSi_xO_y$, $ZrSi_xO_y$, $AlSi_xO_y$, $HfO_2$, $ZrO_2$, $HfAlO_x$, $Al_2O_3$, and may be formed by any suitable deposition technique such as CVD, plasma enhanced CVD, ALD, or sputter, etc.

Figure 3B:
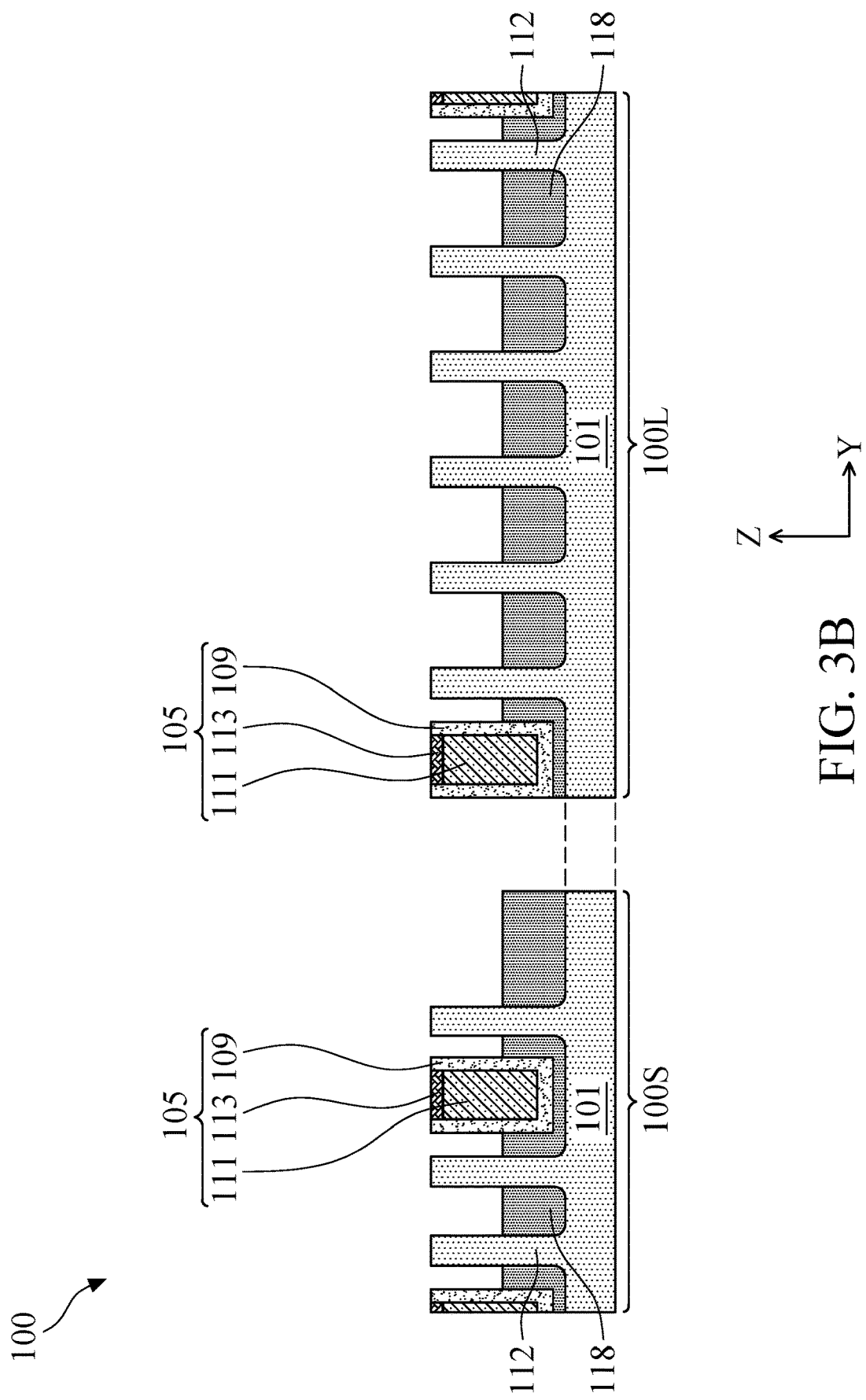

FIGS. 3A and 3B illustrate the recess of the insulating material 118 to form an isolation region in the short channel regions 100S and the long channel regions 100L of the substrate 101. The recess of the insulating material 118 exposes portions of the fins 112 and the dielectric fin structure 105, such as sidewalls of the first dielectric layer 109, in the short channel regions 100S and the long channel regions 100L. The recess of the insulating material 118 may be performed by a suitable a dry etching process, a wet etching process, or a combination thereof. The insulating material 118 may be recessed to any suitable height. In some embodiments, the insulating material 118 is recessed so that a top surface of the insulating material 118 is at a level about half height of the dielectric fin structure 105.

Figure 4A:
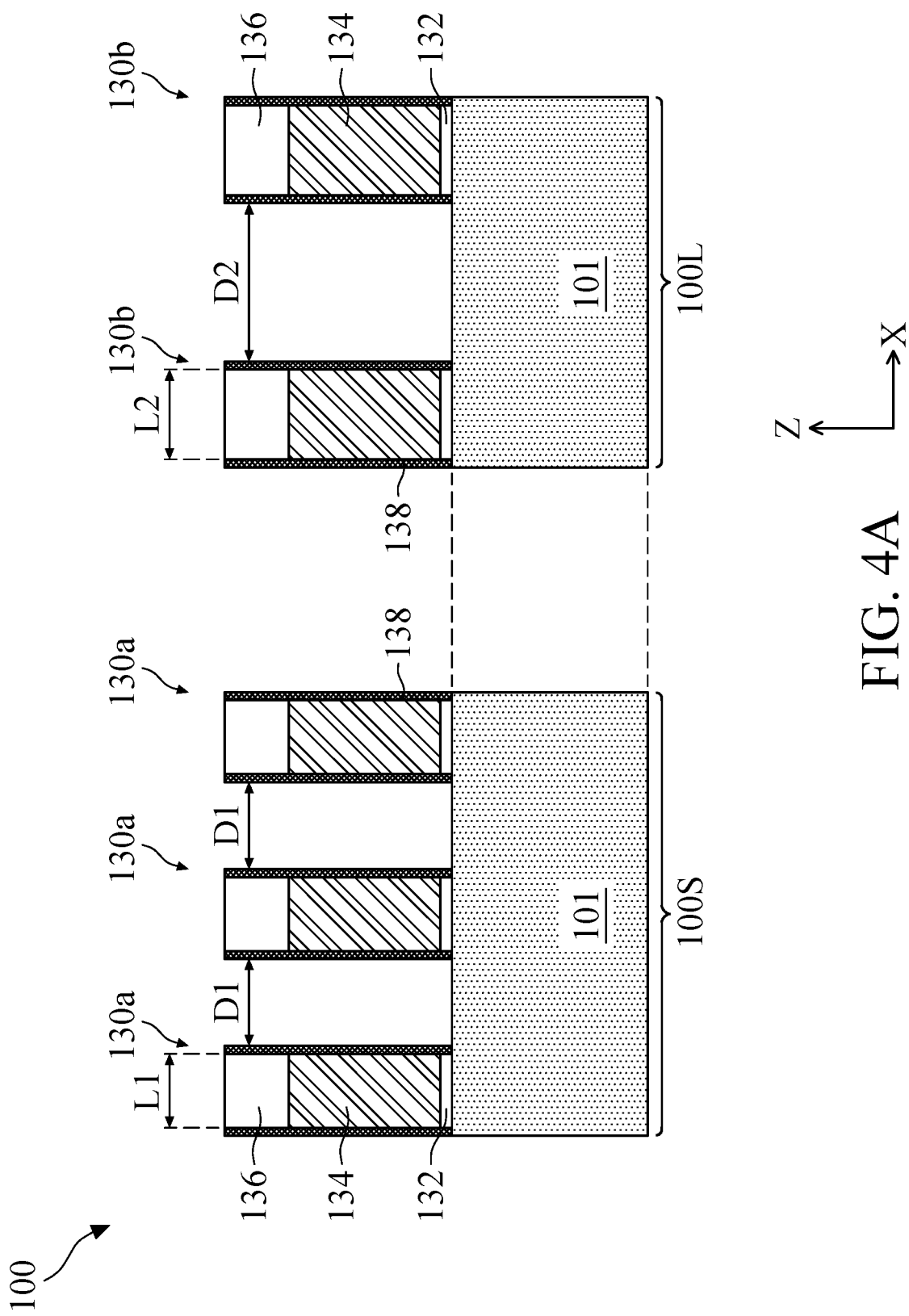
Figure 4B:
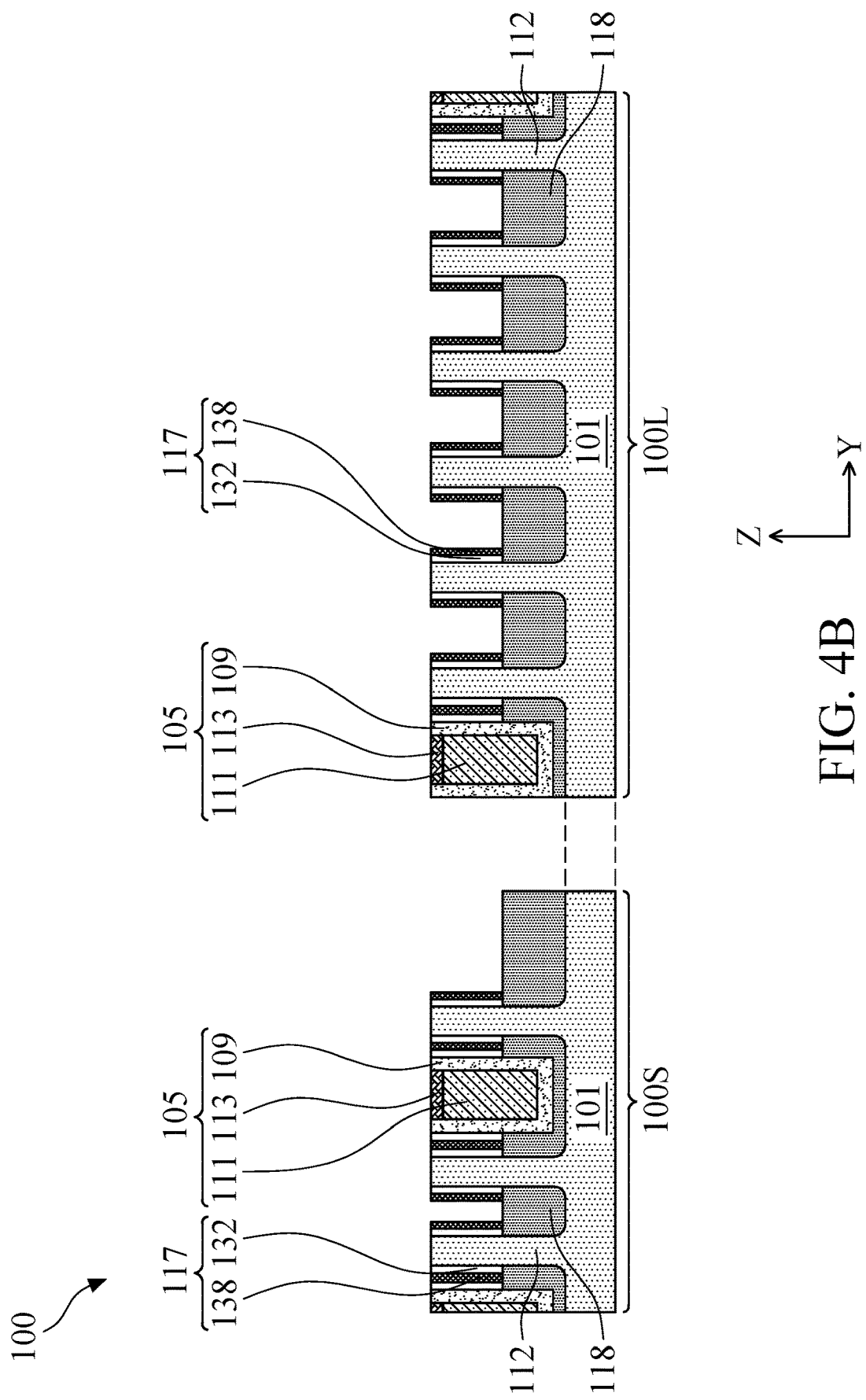

FIGS. 4A and 4B illustrate the formation of sacrificial gate structures 130a, 130b over the semiconductor device structure 100. The sacrificial gate structures 130a and 130b are formed over a portion of the fins 112 in the short channel regions 100S and the long channel regions 100L, respectively. Each sacrificial gate structure 130a, 130b may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially forming respective layers, and then patterning those layers into the sacrificial gate structures 130a, 130b. Gate spacers 138 are then formed on sidewalls of the sacrificial gate structures 130a, 130b. The gate spacers 138 may be formed by conformally depositing one or more layers for the gate spacers 138 and anisotropically etching the one or more layers, for example.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The fins 112 that are partially exposed on opposite sides of each sacrificial gate structures 130a, 130b define source/drain (S/D) regions for the semiconductor device structure 100. In some cases, some S/D regions may be shared between various transistors. For example, various one of the S/D regions in the short channel region 100S may be connected together and implemented as multiple functional transistors. Likewise, various one of the S/D regions in the long channel region 100L may be connected together and implemented as multiple functional transistors.

Each sacrificial gate structure 130a in the short channel regions 100S is formed to have a gate length L1, which is defined by the length of the sacrificial gate electrode layer 134 along the X direction in the short channel regions 100S. Each sacrificial gate structure 130b in the long channel regions 100L is formed to have a gate length L2, which is defined by the length of the sacrificial gate electrode layer 134 along the X direction in the long channel regions 100L. The gate length L2 is greater than the gate length L1. In general, a lateral separation distance "D1" between adjacent sacrificial gate structures 130a in the short channel regions 100S is less than a lateral separation distance "D2" between adjacent sacrificial gate structures 130b in the long channel regions 100L. The lateral separation distances "D1" and "D2" may be in a range from about 60 nm to about 150 nm.

It should be noted that each sacrificial gate structure 130a in the short channel regions 100S and each sacrificial gate structure 130b in the long channel regions 100L may not be formed to have the same gate length. In addition, while three sacrificial gate structures 130a and two sacrificial gate structures 130b are shown in the short channel regions 100S and the long channel regions 100L, respectively, the number of the sacrificial gate structures should not be limited. The short channel regions 100S and the long channel regions 100L may each include any number of the sacrificial gate structures in the X direction at different regions of the substrate 101 in some embodiments.

FIG. 4B also shows portions of the sacrificial gate dielectric layer 132 and the gate spacers 138 formed on the fins 112 partially remain after formation of the sacrificial gate structures 130a, 130b and patterning of the gate spacers 138. The portions of the sacrificial gate dielectric layer 132 and the gate spacers 138 remain on the fins 112 may sometimes be referred to as fin sidewalls 117. In some embodiments, the top of the fin sidewalls 117 is substantially co-planar with the top surface of the fins 112.

Figure 5A:
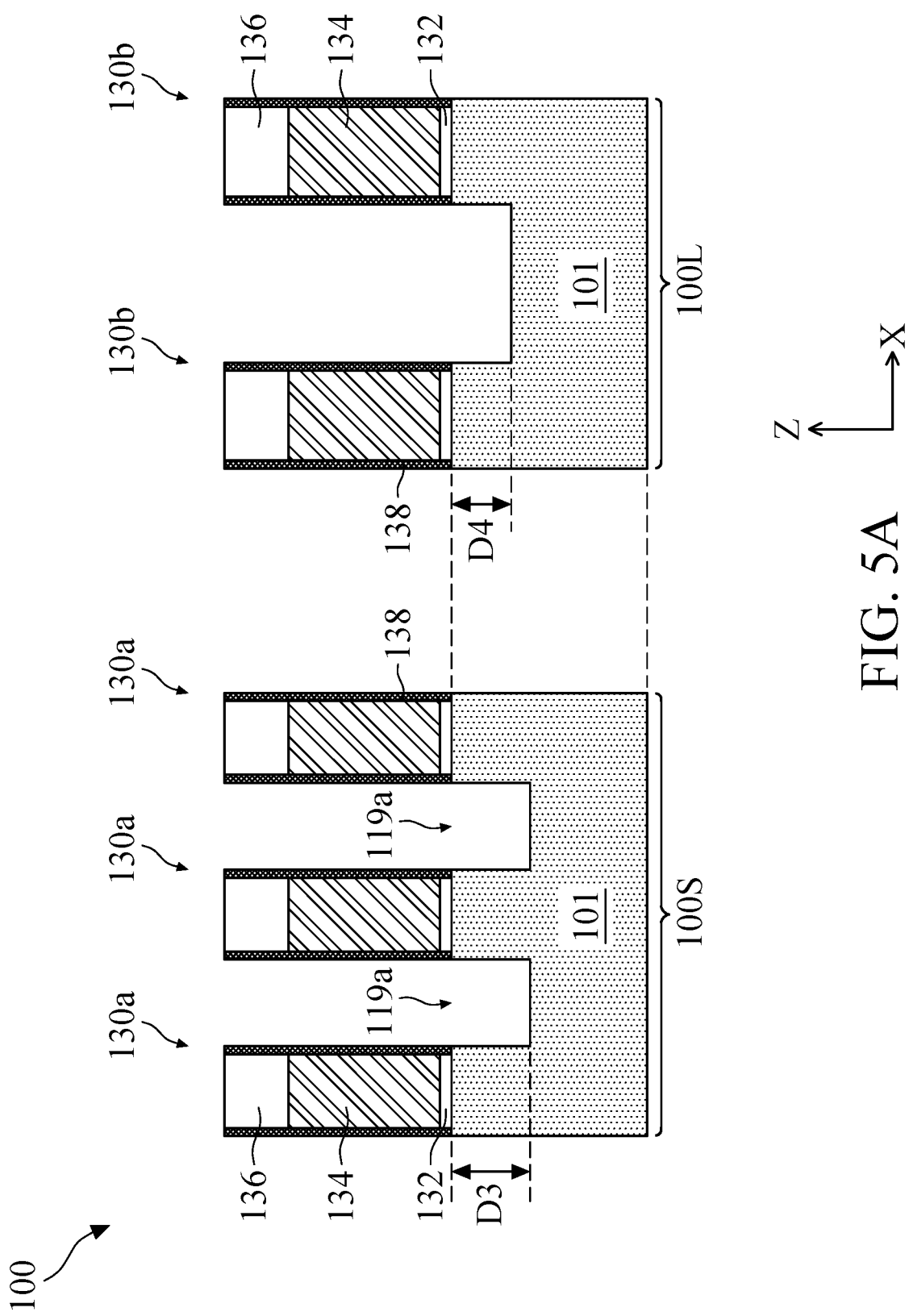
Figure 5B:
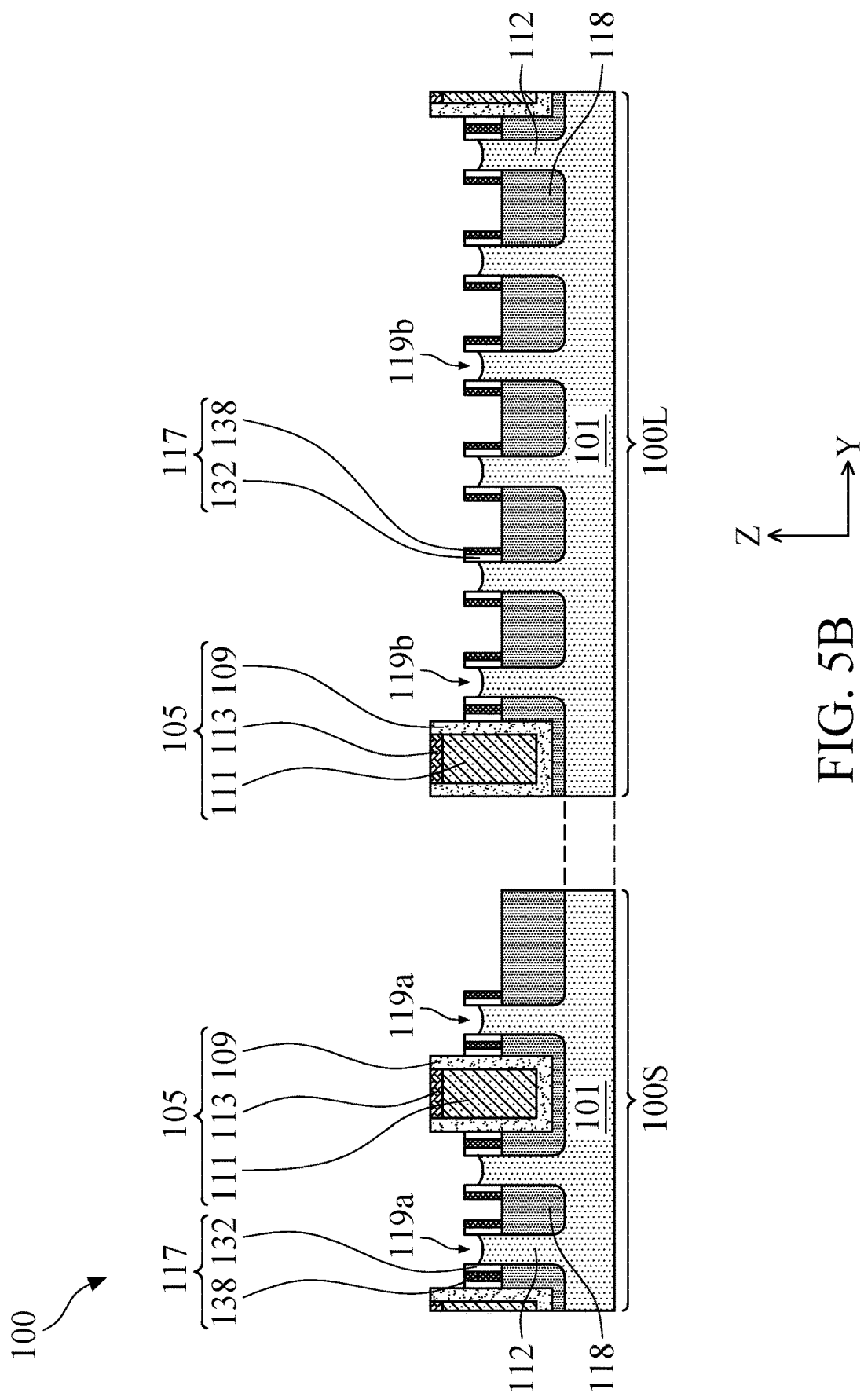

FIGS. 5A and 5B illustrate portions of the fins 112 in the S/D regions are recessed down below the upper surface of the dielectric fin structure 105. In some embodiments, the fins 112 in the S/D regions are recessed down below the upper surface of the insulating material 118. The recess of the fins 112 may be performed by removing portions of the fins 112 not covered by the sacrificial gate structures 130a, 130b. In some embodiments, portions of the fin sidewalls 117 may be partially recessed during removal of the portions of the fins 112. The fin sidewalls 117 may be recessed so that the top of the fin sidewalls 117 is at a level lower than the upper surface of the dielectric fin structure 105, but higher than the top of the fins 112. The portions of the fins 112 and the fin sidewalls 117 may be removed together or separately, and can be done by any suitable removal processes, such as dry etch, wet etch, or a combination thereof. The removal processes may be one or more selective etch processes that remove the fins 112 and the fin sidewalls 117 but not the dielectric fin structures 105. The recessed fin sidewalls 117 may have a height of about 9 nm to about 20 nm.

Trenches 119a, 119b are formed in the S/D regions above the fins 112 and between adjacent fin sidewalls 117 as the result of the recess of the portions of the fins 112, as shown in FIGS. 5A and 5B. As can be seen in FIG. 5A, the trenches 119a at the source/drain regions of the short channel region 100S have a depth "D3", which is a distance measuring from a surface defined by the bottom of the sacrificial gate dielectric 132 under the sacrificial gate structure 130a to the bottom of the trenches 119a. The trenches 119b at the source/drain regions of the long channel region 100L have a depth "D4", which is a distance measuring from a surface defined by the bottom of the sacrificial gate dielectric 132 under the sacrificial gate structure 130b to the bottom of the trenches 119b. The depth "D3" is greater than the depth "D4" due to loading effects of different etch processes between the short channel region 100S and the long channel region 100L.

Figure 6A:
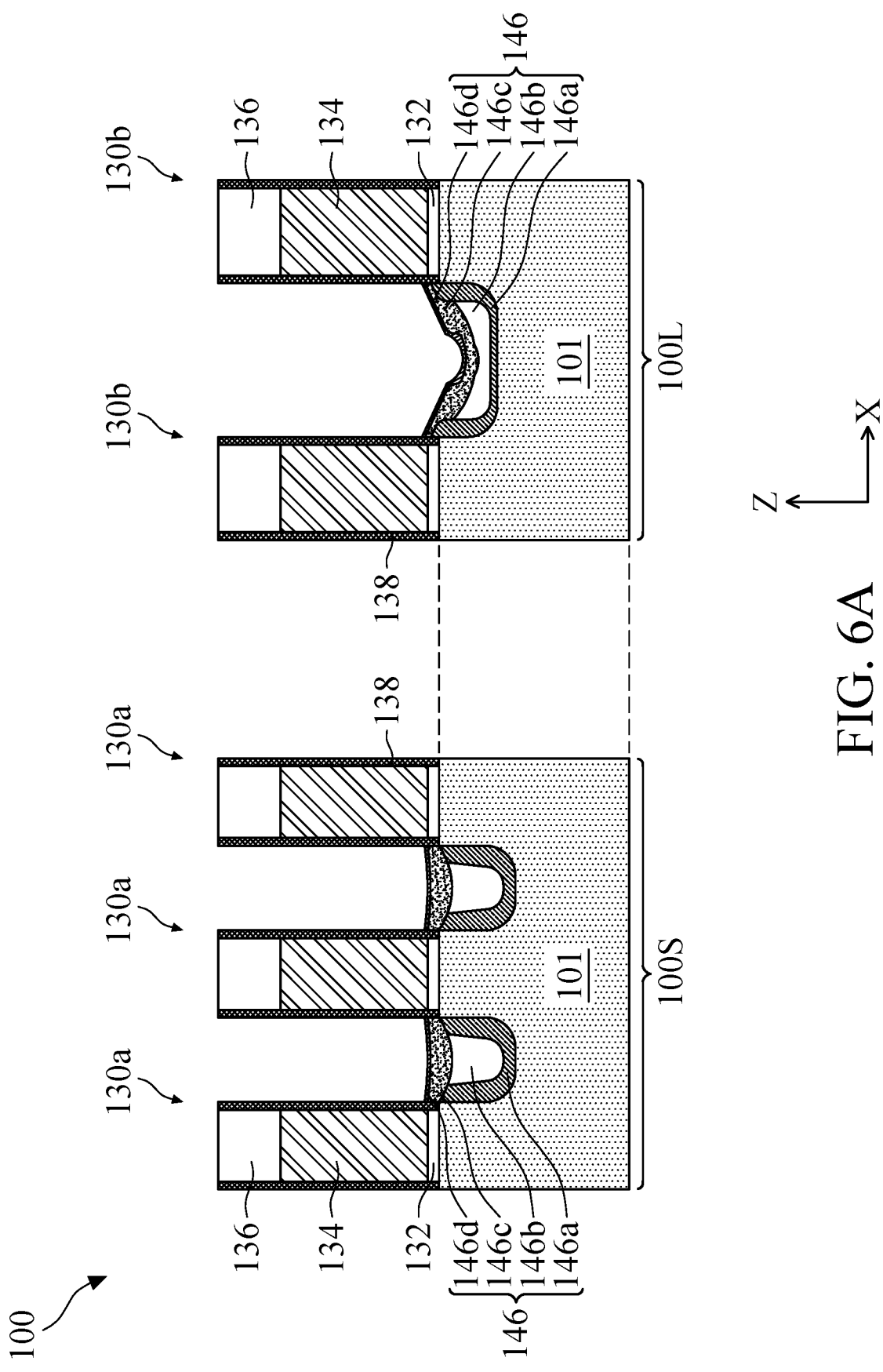
Figure 6B:
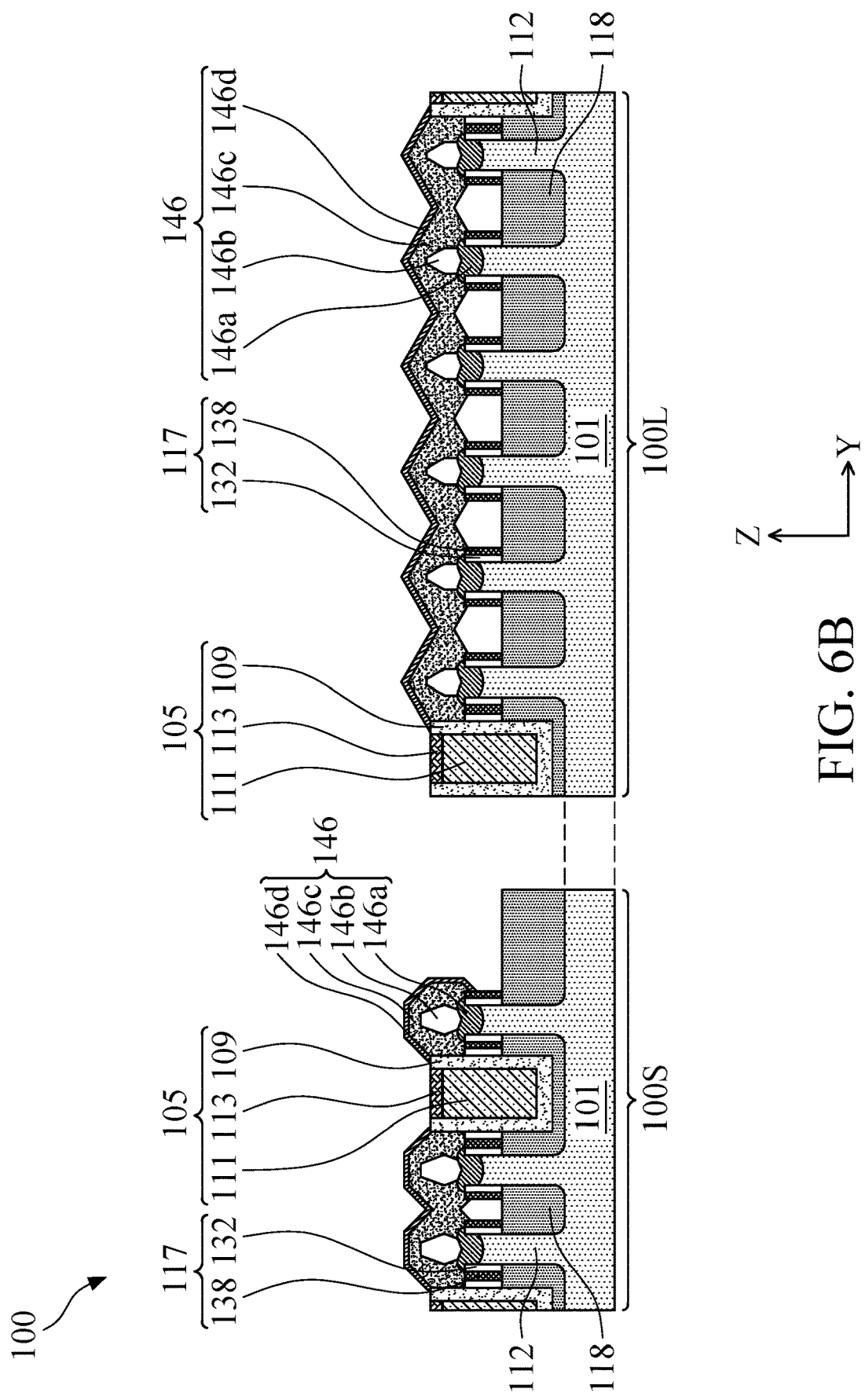

FIGS. 6A and 6B illustrate the formation of epitaxial S/D features 146 at the S/D regions of the short channel regions 100S and the long channel regions 100L. The epitaxial S/D features 146 may include a first epitaxial layer 146a, a second epitaxial layer 146b formed on the first epitaxial layer 146a, a third epitaxial layer 146c formed on the second epitaxial layer 146b and in contact with the first epitaxial layer 146a, and a fourth epitaxial layer 146d formed on the third epitaxial layer 146c.

The first epitaxial layer 146a is formed within the trenches 119a, 119b (FIG. 5A) in the short channel regions 100S and the long channel regions 100L, respectively. The first epitaxial layer 146a may include a semiconductor material, such as Si, SiP, SiC, SiAs, and SiCP for n-channel FETs, or Si, SiGe, Ge for p-channel FETs. Depending on the conductivity type of the device to be formed on the fins 112, the first epitaxial layer 146a may have n-type dopants (e.g., phosphorus (P) or arsenic (As)) or p-type dopants (e.g., boron (B)). In either case, the first epitaxial layer 146a may have a first dopant concentration lower than a dopant concentration of the second epitaxial layer 146b. The lower dopant concentration of the first epitaxial layer 146a avoids dopant diffusion into the channel regions (e.g., the region of the substrate 101 located below the sacrificial gate structures 130a, 130b and between adjacent epitaxial S/D features 146). In some embodiments, the first epitaxial layer 146a may be an undoped silicon layer.

The second epitaxial layer 146b is formed on the first epitaxial layer 146a. In some embodiments, the second epitaxial layer 146b is a semiconductor material, such as Si, SiP, SiC, SiAs, and SiCP for n-channel FETs, or Si, SiGe, Ge for p-channel FETs. Depending on the conductivity type of the device to be formed on the fins 112, the second epitaxial layer 146b may have n-type dopants or p-type dopants. In either case, the second epitaxial layer 146b has a second dopant concentration lower than a dopant concentration of the third epitaxial layer 146c. In some embodiments, the second dopant concentration is in a range between about 15E19 atoms/cm$^3$ and about 5E20 atoms/cm$^3$. The second epitaxial layer 146b may have a thickness along the Z-direction in a range between about 3 nm and about 15 nm. If the thickness of the second epitaxial layer 146b is below 3 nm, the second epitaxial layer 146b may not be thick enough to function as lattice transitional layer between the first epitaxial layer 146a and the third epitaxial layer 146c to be formed. If the thickness of second epitaxial layer 146b is greater than 15 nm, the manufacturing cost is increased without obvious additional advantages for crystalline structural transition.

The third epitaxial layer 146c is formed on the second epitaxial layer 146b. In some embodiments, a portion of the third epitaxial layer 146c is also in contact with the first epitaxial layer 146a. The third epitaxial layer 146c forms a major portion of the epitaxial S/D feature 146. Similarly, the third epitaxial layer 146c may be a semiconductor material, such as Si, SiP, SiC, SiAs, and SiCP for n-channel FETs, or Si, SiGe, Ge for p-channel FETs. Depending on the conductivity type of the device to be formed on the fins 112, the third epitaxial layer 146c may have n-type dopants or p-type dopants. In either case, the third epitaxial layer 146c has a third dopant concentration higher than the second dopant concentration of the second epitaxial layer 146b. The higher dopant concentration of the third epitaxial layer 146c can reduce contact resistance for the epitaxial S/D features 146 and provide better conductivity with the subsequently formed source/drain metal contact (e.g., S/D contacts 176 in FIGS. 11A and 11B). In some embodiments, the third dopant concentration is in a range between about 1E20 atoms/cm$^3$ and about 5E21 atoms/cm$^3$.

The fourth epitaxial layer 146d is formed on the third epitaxial layer 146c. The fourth epitaxial layer 146d can serve as a cap layer to confine dopants in the third epitaxial layer 146c while preventing the third epitaxial layer 146c from being damaged by subsequent cleaning process(es). Likewise, the fourth epitaxial layer 146d may be a semiconductor material, such as Si, SiP, SiC, SiAs, and SiCP for n-channel FETs, or Si, SiGe, Ge for p-channel FETs. Depending on the conductivity type of the device to be formed on the fins 112, the fourth epitaxial layer 146d may have n-type dopants or p-type dopants. In some cases, the fourth epitaxial layer 146d has a fourth dopant concentration higher than the third dopant concentration of the third epitaxial layer 146c. In some cases, the fourth dopant concentration is lower than the third dopant concentration of the third epitaxial layer 146c but higher than the second dopant concentration of the second epitaxial layer 146b. In some embodiments, the fourth dopant concentration is in a range between about 1E21 atoms/cm$^3$ and about 2E21 atoms/cm$^3$. The fourth epitaxial layer 146d may have a thickness along the Z-direction in a range between about 3 nm and about 10 nm.

The first, second, third and fourth epitaxial layers 146a, 146b, 146c, 146d may be formed by any suitable process, such as cyclic deposition etch (CDE) epitaxy process, selective etch growth (SEG) process, ALD, molecular beam epitaxy (MBE), or any combination thereof. In some exemplary embodiments, the first, second, third and fourth epitaxial layers 146a, 146b, 146c, 146d are formed by one or more CDE epitaxy processes. In one embodiment, the first epitaxial layer 146a is formed within the trenches 119a, 119b (FIGS. 5A and 5B) using a first CDE epitaxy process. The first CDE epitaxy process may include an epitaxial growth where the trenches 119a, 119b are exposed to a gas mixture comprising one or more silicon-containing precursors (e.g., SiCl$_2$H$_2$, SiH$_4$, Si$_2$H$_6$, etc.), a p-type or n-type dopant gas (e.g., B, P, As, etc.), and a carrier gas (e.g., Ar, H$_2$, etc.) for a first period of time to form the first epitaxial layer 146a, followed by a selective etch where the first epitaxial layer 146a are exposed to etchants such as halide gases (e.g., HCl, Cl$_2$, etc.) for a second period of time to selectively remove amorphous or polycrystalline portions of the first epitaxial layer 146a while leaving crystalline portions of the first epitaxial layer 146a intact. The epitaxial growth and selective etch of the first CDE epitaxy process are repeated until a desired thickness the first epitaxial layer 146a and above-mentioned dopant concentration (e.g., first dopant concentration) are achieved. Additional operations may include an anneal process after the first CDE epitaxy process to activate dopants.

Figure 6C:
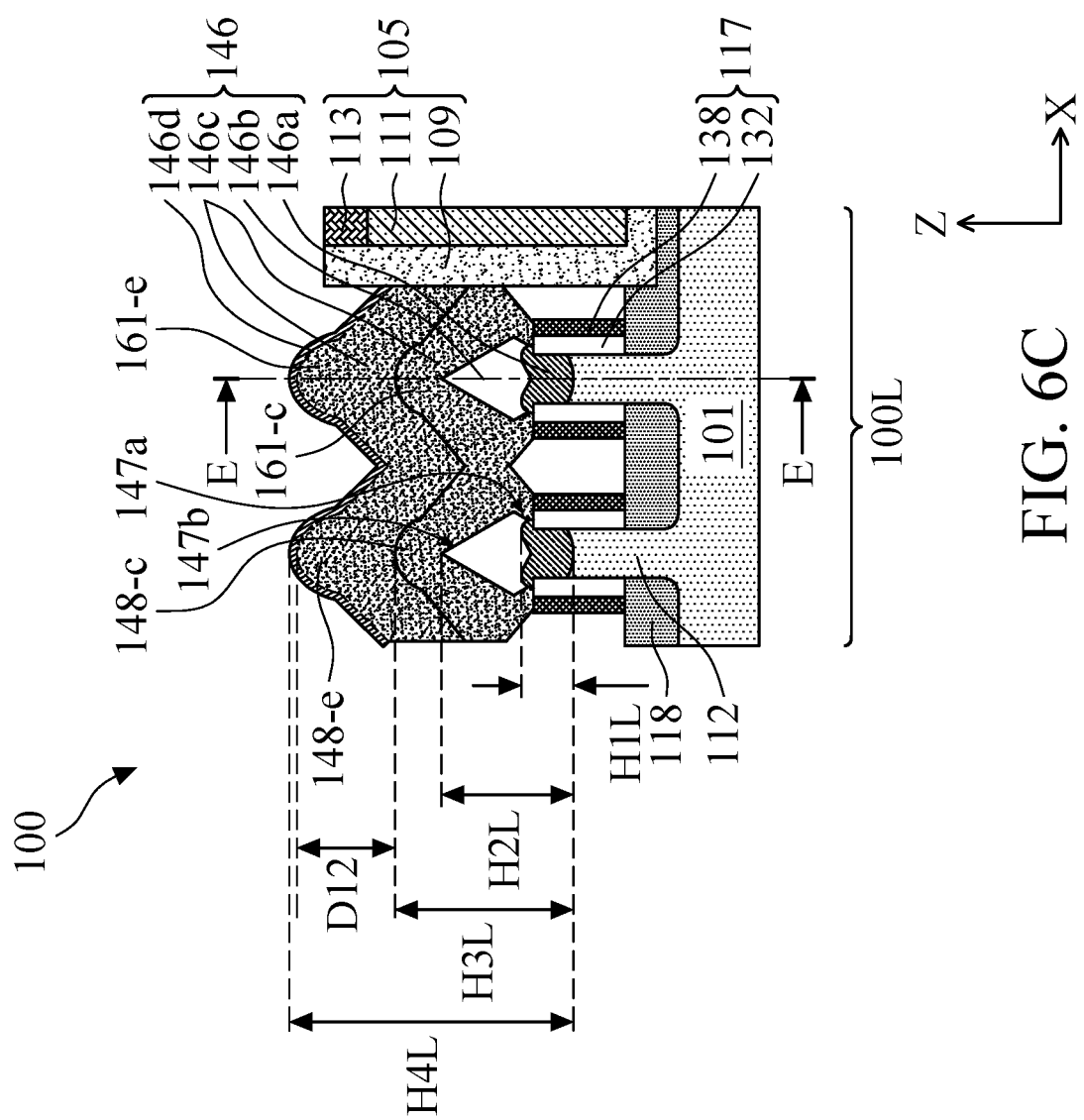
FIGS. 6C and 6D are cross-sectional views of a portion of the semiconductor device structure of FIGS. 6A and 6B in accordance with some embodiments.
Figure 6D:
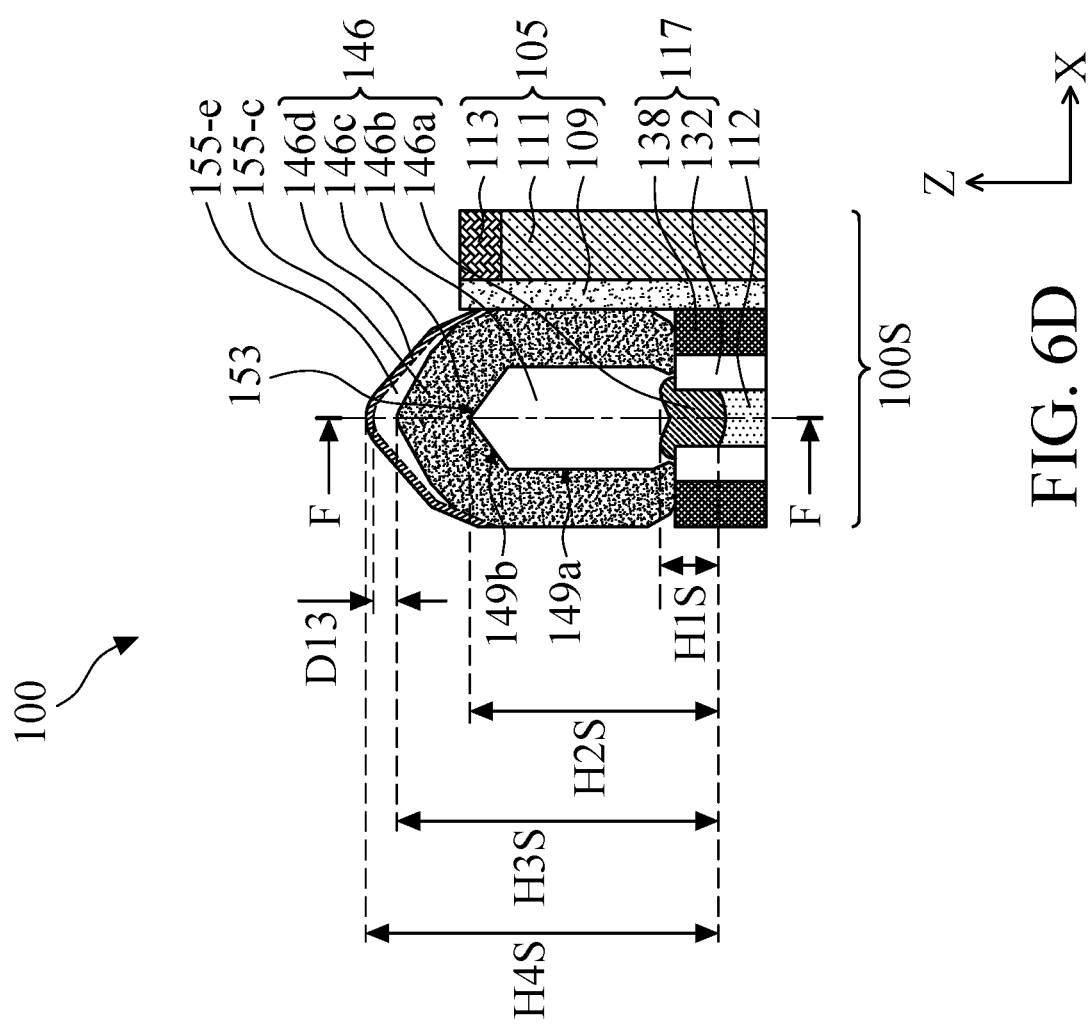

FIGS. 6C and 6D are cross-sectional views of a portion of the semiconductor device structure 100 of FIGS. 6A and 6B in the Z-Y plane, showing the epitaxial S/D features 146 in the short channel and long channel regions 100S, 100L, respectively, in accordance with some embodiments. As can be seen in FIGS. 6C and 6D, a portion of the first epitaxial layer 146a is formed on the fins 112 and in contact with the sacrificial gate dielectric layer 132 in the short channel and long channel regions 100S, 100L. The rest portion of the first epitaxial layer 146a beyond the top of the fin sidewalls 117 is grown freely and form minor facets. In some embodiments, a portion of the first epitaxial layer 146a is further in contact with the gate spacer 138 in the short channel and long channel regions 100S, 100L. The first epitaxial layer 146a in the short channel region 100S may have a height H1S that is about the same as the height H1L of the first epitaxial layer 146a in the long channel region 100S.

After the first epitaxial layers 146a in the short channel and long channel regions 100S, 100L are formed, a second CDE epitaxy process is performed to form the second epitaxial layer 146b on the first epitaxial layer 146a. Similarly, the second CDE epitaxy process may include an epitaxial growth where the first epitaxial layers 146a are exposed to a gas mixture comprising one or more silicon-containing precursors (e.g., $SiCl_2H_2$, $SiH_4$, $Si_2H_6$, etc.), a p-type or n-type dopant gas (e.g., B, P, As, etc.), and a carrier gas (e.g., Ar, $H_2$, etc.) for a first period of time to form the second epitaxial layer 146b, followed by a selective etch where the second epitaxial layer 146b are exposed to etchants such as halide gases (e.g., HCl, $Cl_2$, etc.) for a second period of time to selectively remove amorphous or polycrystalline portions of the second epitaxial layer 146b while leaving crystalline portions of the second epitaxial layer 146b intact. The epitaxial growth and selective etch of the second CDE epitaxy process are repeated until a desired thickness the second epitaxial layers 146b and above-mentioned dopant concentration (e.g., second dopant concentration) are achieved. Additional operations may include an anneal process after the second CDE epitaxy process to activate dopants.

During epitaxial growth of the second epitaxial layers 146b, due to different growth rates on different surface planes, facets may be formed. For example, the growth rate on surfaces having (111) surface orientations (referred to as (111) planes) is often lower than on other planes such as (110) and (100) planes. Therefore, the second epitaxial layers 146b may have facets 147a, 147b (FIG. 6C), 149a, 149b (FIG. 6D) as a result of difference in growth rates of the different planes. In some embodiments, which can be combined with any one or more embodiments of the present disclosure, the second CDE epitaxy process is performed so that the growth rate on (100) planes is higher than the growth rate on (110) and (111) planes, and the growth rates on (110) and (111) planes are substantially the same. In some embodiments, the growth rate of (100), (110), and (111) planes is in a ratio (100):(110):(111) of about 0.8:0.2:0.2 to about 3.5: 0.35:0.35, for example about 1:0.3:0.2. In one embodiment, the growth rate of (100), (110), and (111) planes is in a ratio (100):(110):(111) of about 1.1:0.35:0.2. Due to different gate lengths (e.g., gate length L1, L2 in FIG. 4A) and different gate spacings (e.g., lateral separation distance D1, D2 in FIG. 4A) of the sacrificial gate structure 130a, 130b in the short channel regions 100S and long channel regions 100L, the difference in the above-mentioned growth rates of the different planes can result in the second epitaxial layers 146b in the short channel regions 100S to form in a substantial bar-like shape while the second epitaxial layers 146b in the long channel regions 100L to form in a substantial diamond-like shape, as shown in FIGS. 6C and 6D. The term "bar-like shape" described herein refers to any object that has a sectional of polygonal-shaped, tubular-shaped, cylindrical-shaped, rod-shaped, or the like, and has a substantial uniform diameter along the longitudinal direction of the object. In some embodiments, the bar-like shape of the second epitaxial layers 146b in the short channel regions 100S may have a distal end 153 that is a rounded, flattened, tapered, or conical shape. The term "diamond-like shape" described herein refers to any object that has at least one facet having a (111) crystallographic orientation.

Comparing to the epitaxial S/D features 146 in the short channel regions 100S, the epitaxial S/D features 146 in the long channel regions 100L may have lower raise height (RH) partially due to larger gate spacing (e.g., lateral separation distance D2 in FIG. 4A) of the sacrificial gate structure 130b. The diamond-like shape of the second epitaxial layers 146b in the long channel regions 100L can help raise the height of the subsequent layers (e.g., third epitaxial layer 146c), which in turn increases the final raise height and thus the surface area of the epitaxial S/D features 146 for the subsequent S/D contacts 176 (FIGS. 11A and 11B) to conduct more current. As a result, the contact resistance of epitaxial S/D features 146 in the long channel regions or I/O regions is reduced and the device performance of the transistors is improved. The term "raise height" described herein refers to the center height of the epitaxial S/D feature 146 above the top of the fin 112. If the growth rate ratio of (100), (110), and (111) planes is less than 0.8:0.2:0.2, the final raise height of the epitaxial S/D features 146 in the long channel regions 100L may be too short and not provide enough surface area for the subsequent S/D contacts 176 (FIG. 11B) to provide electrical current needed for properly operating the I/O circuit devices, the performance of the I/O circuit devices in the long channel region 100L is reduced. On the other hand, if the growth rate ratio of (100), (110), and (111) planes is greater than 3.5:0.35:0.35, the critical dimension uniformity of the fins 112 and fin sidewalls 117 in the short channel regions 100S may suffer and the final raise height of the epitaxial S/D features 146 in the short channel regions 100S may increase and merge with unwanted neighboring devices.

The growth rate on different planes can affect the final shape of the epitaxial S/D features 146 in the short channel and long channel regions 100S, 100L. It has been observed that the final raise height of the epitaxial S/D features 146 in the short channel regions 100S is dominated by the growth rates on (111) and (100) planes, and the final raise height of the epitaxial S/D features 146 in the long channel regions 100L is dominated by the growth rate on (100) planes. The fine balance of the growth rates between different planes can be adjusted to achieve the above-mentioned growth rate ratio by adjusting process conditions of the second CDE epitaxy process. For example, the growth rate of the second epitaxial layer 146b may be altered by adjusting a flow rate of one or more silicon-containing precursors within a processing chamber where the second CDE epitaxy process takes place, or by altering an etch rate by adjusting a temperature or partial pressure of one or more etchants or the temperature within the processing chamber. Exemplary second CDE may include an epitaxial deposition process performed in a process chamber at a temperature in a range between about 400° C. and 800° C., under a pressure in a range between about 100 Torr and 600 Torr, and performed for a time duration in a range between about 20 seconds and 300 seconds, by using a silicon-containing gas such as $SiH_4$, and/or $SiCl_2H_2$, a dopant gas, such as B, $PH_3$, or $AsH_3$, an etchant gas, such as HCl, and a carrier gas, such as $H_2$. $SiH_4$ may be provided at a flow rate in a range between 10 sccm and 100 sccm, $SiCl_2H_2$ may be provided at a flow rate in a range between 200 sccm and 2000 sccm, $PH_3$ may be provided at a flow rate in a range between 50 sccm and 500 sccm, HCl may be provided at a flow rate in a range between 50 sccm and 400 sccm, and $H_2$ at a flow rate in a range between 2000 sccm and 50000 sccm. The etch process following the epitaxial deposition process may be performed at a temperature in a range between about 600° C. and 800° C., under a pressure in a range between about 5 Torr and 500 Torr, and performed for a time duration in a range between about 2 seconds and 60 seconds, by using an etchant, such as HCl. The etchant may be provided a flow rate in a range between 50 sccm and 1000 sccm.

Figure 6E:
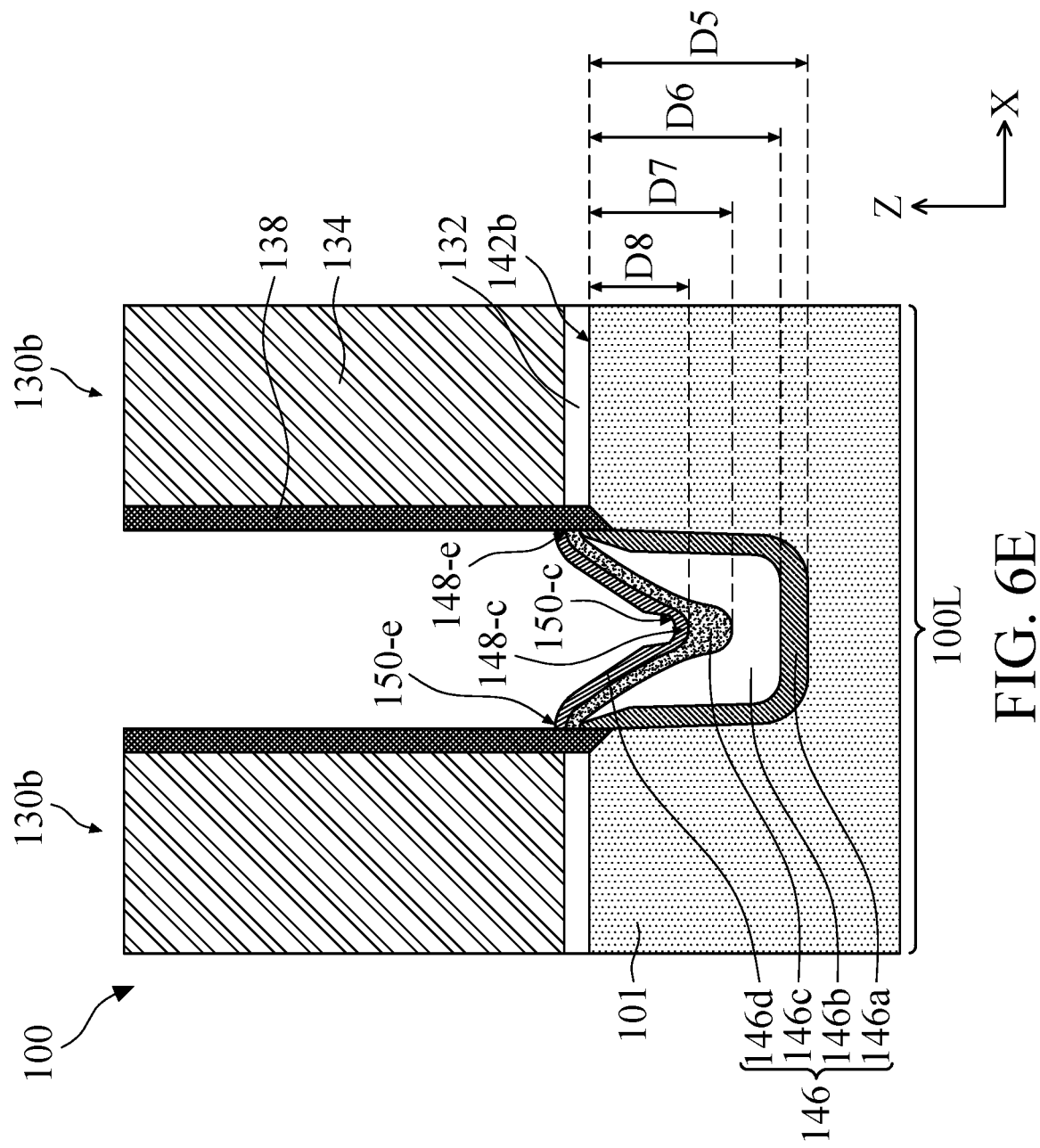
FIGS. 6E and 6F are cross-sectional views of the semiconductor device structure taken along cross-section E-E of FIG. 6C and cross-section F-F of FIG. 6D, respectively, in accordance with some embodiments.
Figure 6F:
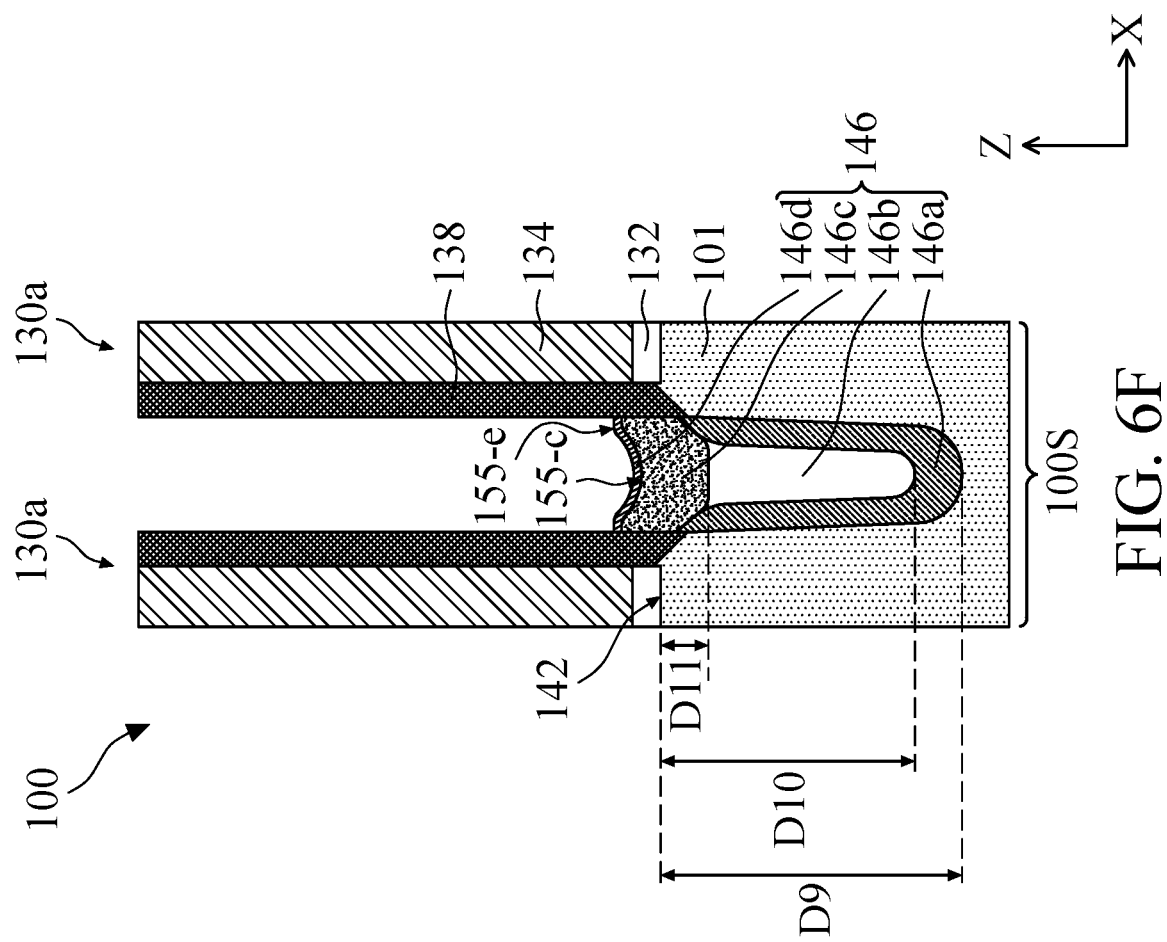

Due to smaller gate length (e.g., gate length L1 in FIG. 4A) and smaller gate spacing (e.g., lateral separation distance D1 in FIG. 4A) of the sacrificial gate structure 130a in the short channel regions 100S, the second epitaxial layer 146b can form on the first epitaxial layer 146a at a faster deposition rate than that of the second epitaxial layer 146b in the long channel region 100L during the second CDE epitaxy process, resulting in the second epitaxial layer 146b in the short channel region 100S with a height H2S that is greater than the height H2L of the second epitaxial layer 146b in the long channel region 100S. In some embodiments, both heights H2S and H2L are greater than the height H1S and H1L, respectively. In addition, the larger gate spacing (e.g., lateral separation distance D2 in FIG. 4A) of the sacrificial gate structure 130b may cause the third epitaxial layers 146c in the short channel region 100S and the long channel region 100L to have different profile when viewed from the side in the Z-X plane. As can be seen in FIGS. 6E and 6F, which are cross-sectional views of the semiconductor device structure 100 taken along cross-section E-E of FIG. 6C and cross-section F-F of FIG. 6D, respectively, in accordance with some embodiments, the second epitaxial layer 146b in the long channel region 100L has a substantially V-shaped or U-shaped profile, while the third epitaxial layer 146c in the short channel region 100S has a substantially long oval shape profile when viewed from the side in the Z-X plane.

After the second epitaxial layers 146b in the short channel and long channel regions 100S, 100L are formed, a third CDE epitaxy process is performed to form the third epitaxial layer 146c on the second epitaxial layer 146b (and in contact with the first epitaxial layer 146a in some cases). Similarly, the third CDE epitaxy process may include an epitaxial growth where the second epitaxial layers 146b are exposed to a gas mixture comprising one or more silicon-containing precursors (e.g., $SiCl_2H_2$, $SiH_4$, $Si_2H_6$, etc.), a p-type or n-type dopant gas (e.g., B, P, As, etc.), and a carrier gas (e.g., Ar, $H_2$, etc.) for a first period of time to form the third epitaxial layer 146c, followed by a selective etch where the third epitaxial layer 146c are exposed to etchants such as halide gases (e.g., HCl, $Cl_2$, etc.) for a second period of time to selectively remove amorphous or polycrystalline portions of the third epitaxial layer 146c while leaving crystalline portions of the third epitaxial layer 146c intact. The epitaxial growth and selective etch of the third CDE epitaxy process are repeated until a desired thickness the third epitaxial layers 146c and above-mentioned dopant concentration (e.g., third dopant concentration) are achieved. Additional operations may include an anneal process after the third CDE epitaxy process to activate dopants.

Exemplary third CDE may include an epitaxial deposition process performed in a process chamber at a temperature in a range between about 400° C. and 800° C., under a pressure in a range between about 100 Torr and 600 Torr, and performed for a time duration in a range between about 50 seconds and 400 seconds, by using a silicon-containing gas such as $SiH_4$, and/or $SiCl_2H_2$, a dopant gas, such as B, $PH_3$, or $AsH_3$, an etchant gas, such as HCl, and a carrier gas, such as $H_2$. $SiH_4$ may be provided at a flow rate in a range between 10 sccm and 100 sccm, $SiCl_2H_2$ may be provided at a flow rate in a range between 0 sccm and 2000 sccm, $PH_3$ may be provided at a flow rate in a range between 100 sccm and 500 sccm, HCl may be provided at a flow rate in a range between 50 sccm and 500 sccm, and $H_2$ at a flow rate in a range between 2000 sccm and 50000 sccm. The etch process following the epitaxial deposition process may be performed at a temperature in a range between about 600° C. and 800° C., under a pressure in a range between about 5 Torr and 500 Torr, and performed for a time duration in a range between about 10 seconds and 80 seconds, by using an etchant, such as HCl. The etchant may be provided a flow rate in a range between 50 sccm and 1000 sccm.

Likewise, the smaller gate length and smaller gate spacing of the sacrificial gate structures 130a in the short channel regions 100S would cause the third epitaxial layer 146c to form on the second epitaxial layer 146b at a faster deposition rate than that of the third epitaxial layer 146c in the long channel region 100L during the third CDE epitaxy process, resulting in the third epitaxial layer 146c in the short channel region 100S with a height H3S that is greater than the height H3L of the third epitaxial layer 146c in the long channel region 100S. In some embodiments, both heights H3S and H3L are greater than the height H2S and H2L, respectively. Due to larger gate spacing of the sacrificial gate structure 130b, the third epitaxial layer 146c in the long channel region 100L may have a substantially V-shaped or U-shaped profile when viewed from the side in the Z-X plane, while the third epitaxial layer 146c in the short channel region 100S has a substantially bowl-shaped profile when viewed from the side in the Z-X plane, as shown respectively in FIGS. 6E and 6F. In some embodiments, the third epitaxial layers 146c in the long channel region 100L may each has a center (or valley) portion 148-c, 161-c and an edge (or ridge) portion 148-e, 161-c that is higher than the center portion 148-c, 161-c, as shown in FIG. 6C. In FIG. 6C, the center portions 148-c, 161-c are represented by solid lines and the edge portions 148-e, 161-e, which are represented by dotted lines, is shown into the paper behind the center portions 148-c, 161-c. Each of the edge portions 148-e, 161-e may be higher than the respective center portion 148-c, 161-c by a height difference D12. In some embodiments, the height difference D12 is about 20 nm to about 25 nm, for example about 22 nm. Assuming the edge portions 148-e, 161-e remain at the same level, if the height difference D12 is greater than 25 nm, the final raise height of the epitaxial S/D features 146 in the long channel region 100L may not be enough to provide needed contact surface area for the subsequent S/D contacts 176 (FIG. 11B) and thus, the performance of the I/O circuit devices in the long channel region 100L is reduced. In some embodiments shown in FIG. 6E, the edge portion 148-e of the third epitaxial layer 146c is in contact with the gate spacers 138.

As shown in FIG. 6C, in some embodiments, a portion of each center portion 148-c, 161-c of the third epitaxial layers 146c is in contact with the sacrificial gate dielectric layer 132 in the long channel region 100L. In some embodiments, a portion of each center portion 148-c, 161-c of the third epitaxial layer 146c is further in contact with the gate spacer 138 in the long channel region 100L.

In some embodiments, the third epitaxial layers 146c in the short channel region 100S may be formed to have a center (or valley) portion 155-c and an edge (or ridge) portion 155-e that is higher than the center portion 155-c, as shown in FIG. 6D. In FIG. 6D, the center portion 155-c is represented by solid lines and the edge portion 155-e, which is represented by dotted lines, is shown into the paper behind the center portion 155-c. The edge portion 155-e may be higher than the center portion 155-c by a height difference D13. In some embodiments, the height difference D13 is about 6 nm to about 15 nm, for example about 10 nm. Assuming the edge portion 155-e remains at the same level, if the height difference D13 is greater than 15 nm, the final raise height of the epitaxial S/D features 146 in the short channel region 100S may not be enough to provide needed contact surface area for the subsequent S/D contacts 176 (FIG. 11B) and thus, the performance of the core circuit devices in the short channel region 100S is reduced. In some embodiments, the edge portion 155-e of the third epitaxial layer 146c is in contact with the gate spacers 138, as shown in FIG. 6F.

As shown in FIG. 6D, in some embodiments, a portion of the center portion 155-c of the third epitaxial layer 146c is in contact with the sacrificial gate dielectric layer 132 in the short channel region 100L. In some embodiments, a portion of the center portion 155-c of the third epitaxial layer 146c is further in contact with the gate spacer 138 in the short channel region 100L.

After the third epitaxial layers 146c in the short channel and long channel regions 100S, 100L are formed, a fourth CDE epitaxy process is performed to form the fourth epitaxial layer 146d on the third epitaxial layer 146c. Similarly, the fourth CDE epitaxy process may include an epitaxial growth where the third epitaxial layers 146c are exposed to a gas mixture comprising one or more silicon-containing precursors (e.g., $SiCl_2H_2$, $SiH_4$, $Si_2H_6$, etc.), a p-type or n-type dopant gas (e.g., B, P, As, etc.), and a carrier gas (e.g., Ar, $H_2$, etc.) for a first period of time to form the fourth epitaxial layer 146d, followed by a selective etch where the fourth epitaxial layer 146d are exposed to etchants such as halide gases (e.g., HCl, $Cl_2$, etc.) for a second period of time to selectively remove amorphous or polycrystalline portions of the fourth epitaxial layer 146d while leaving crystalline portions of the fourth epitaxial layer 146d intact. The epitaxial growth and selective etch of the fourth CDE epitaxy process are repeated until a desired thickness the fourth epitaxial layers 146d and above-mentioned dopant concentration (e.g., fourth dopant concentration) are achieved. Additional operations may include an anneal process after the fourth CDE epitaxy process to activate dopants.

The fourth epitaxial layer 146d in the short channel and long channel regions 100S, 100L has a substantially V-shaped or bowl-shaped profile that follows the profile of the third epitaxial layer 146c. For example, the fourth epitaxial layer 146d in the long channel region 100L may also have a center (or valley) portion 150-c and an edge (or ridge) portion 150-e that is higher than the center portion 150-c. In some embodiments, the edge portion 150-e of the fourth epitaxial layer 146d is in contact with the gate spacers 138.

FIG. 6E further illustrates that the first epitaxial layer 146a in the long channel region 100L has a depth D5, which corresponds to a distance measuring from an interface 142b between the bottom of the sacrificial gate dielectric 132 under the sacrificial gate structure 130b and the fin 112 to the bottom of the first epitaxial layer 146a. The second epitaxial layer 146b has a depth D6, which corresponds to a distance measuring from the interface 142b to the bottom of the second epitaxial layer 146b. The third epitaxial layer 146c has a depth D7, which corresponds to a distance measuring from the interface 142b to the bottom of the third epitaxial layer 146c. The fourth epitaxial layer 146d has a depth D8, which corresponds to a distance measuring from the interface 142b to the bottom of the fourth epitaxial layer 146d. In some embodiments, the depth D5 is greater than the depth D6, the depth D6 is greater than the depth D7, and the depth D7 is greater than the depth D8.

Likewise, the first epitaxial layer 146a in the short channel region 100S has a depth D9, which corresponds to a distance measuring from an interface 142a between the bottom of the sacrificial gate dielectric 132 under the sacrificial gate structure 130a and the fin 112 to the bottom of the first epitaxial layer 146a. The second epitaxial layer 146b in the short channel region 100S has a depth D10, which corresponds to a distance measuring from the interface 142a to the bottom of the second epitaxial layer 146b. The third epitaxial layer 146c in the short channel region 100S has a depth D11, which corresponds to a distance measuring from the interface 142a to the bottom of the third epitaxial layer 146c. In some embodiments, the depth D9 is greater than the depth D10, and the depth D10 is greater than the depth D11. In some embodiments, the depth D10 is greater than the depth D5. In some embodiments, the bottom of the fourth epitaxial layer 146d may be at or slightly above the interface 142a. In some embodiments, a portion (e.g., an edge portion) of the third and fourth epitaxial layers 146c, 146d in the short channel region 100S may be in contact with the gate spacers 138.

While CDE epitaxy process is discussed to form the first, second, third, and fourth epitaxial layers 146a, 146b, 146c, 146d, these layers can be formed by selective etch growth (SEG) process in which a cyclic deposition process is performed (e.g., by exposing the semiconductor device structure 100 to pulses of deposition precursors, such as those discussed above in the CDE epitaxy process) to sequentially deposit the first, second, third, and fourth epitaxial layers 146a, 146b, 146c, 146d. Throughout the SEG process, the semiconductor device structure 100 is also exposed to a continuous flow of one or more etchants, such as those discussed above in the CDE epitaxy process, to selectively etch away amorphous portions of the epitaxy layer while leaving crystalline portions intact. In some embodiments, one or more of the first, second, third, and fourth epitaxial layers 146a, 146b, 146c, 146d may be formed by the CDE epitaxy process and one or more of the first, second, third, and fourth epitaxial layers 146a, 146b, 146c, 146d may be formed by the SEG process.

Figure 7A:
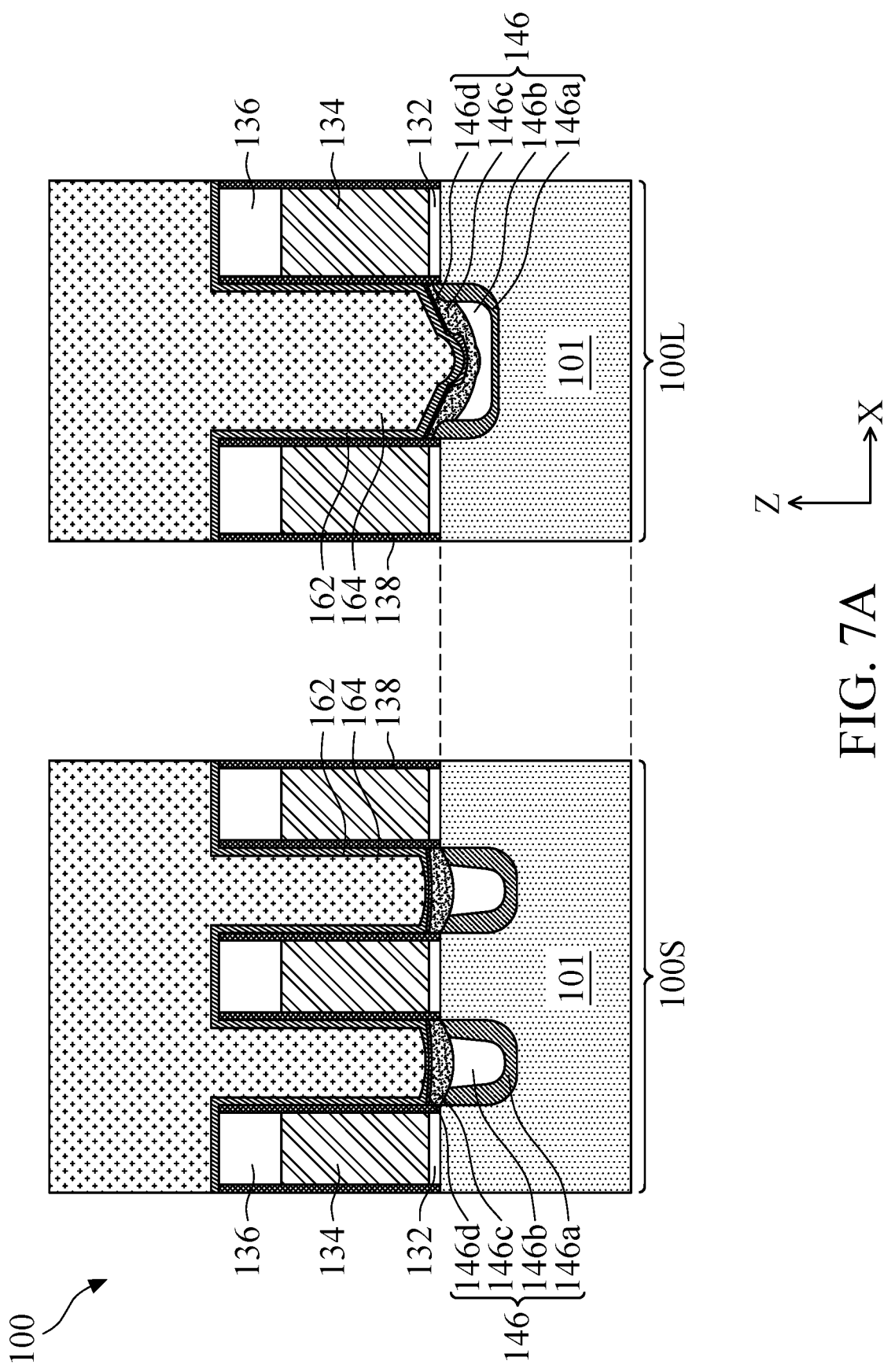
Figure 7B:
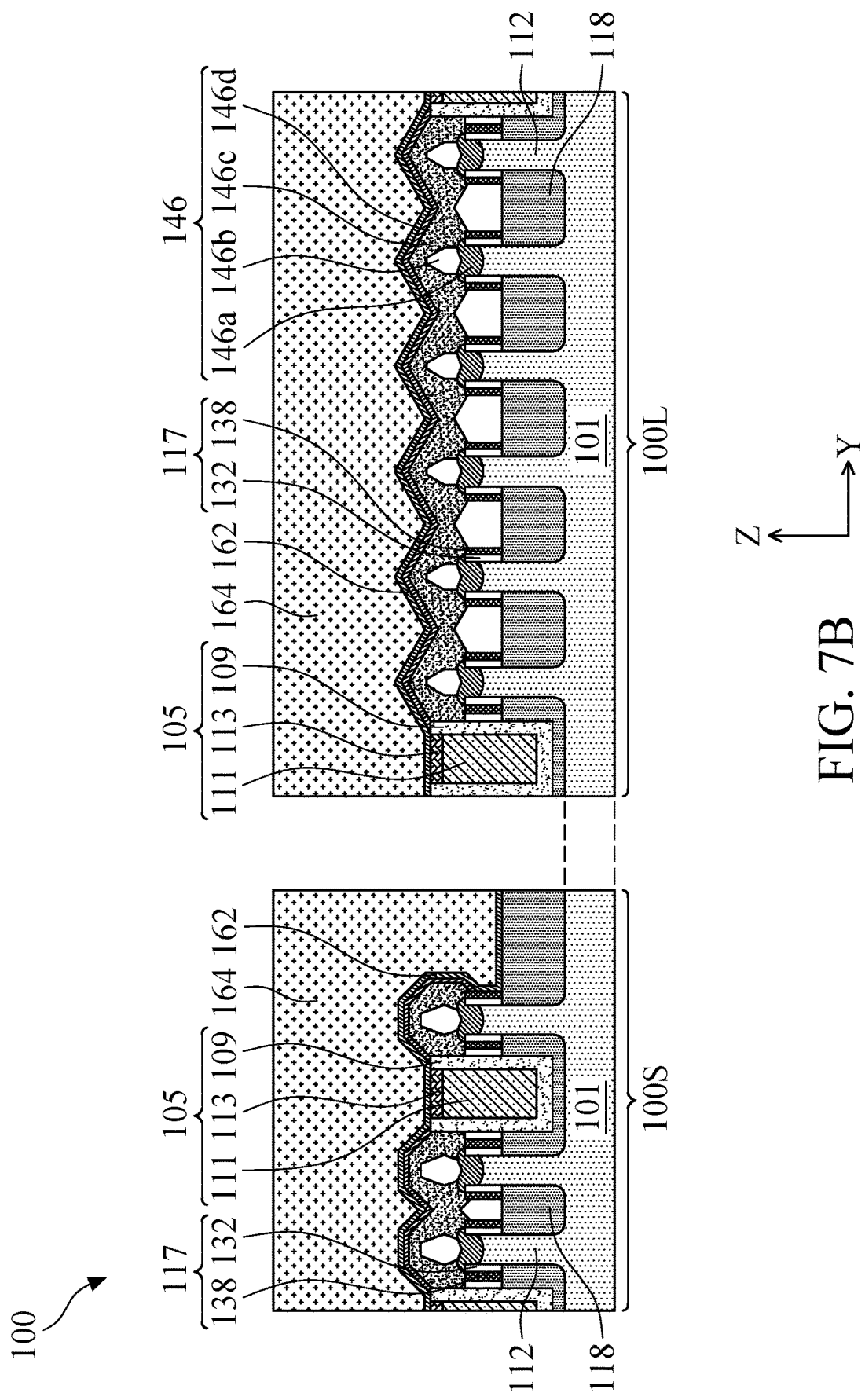

FIGS. 7A and 7B illustrate the formation of a contact etch stop layer (CESL) 162 and an interlayer dielectric (ILD) layer 164 in the S/D regions of the short channel regions 100S and the long channel regions 100L, respectively. The CESL 162 is conformally formed on the exposed surfaces of the semiconductor device structure 100. The CESL 162 covers the sidewalls of the sacrificial gate structure 130a, 130b in the short and long channel regions 100S, 100L, the insulating material 118, the epitaxial S/D features 146, and the dielectric fin structure 105. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, the ILD layer 164 is formed on the CESL 162 over the semiconductor device structure 100. The materials for the ILD layer 164 may include compounds comprising Si, O, C, and/or H, such as silicon oxide, TEOS oxide, SiCOH and SiOC. Organic materials, such as polymers, may also be used for the ILD layer 164. The ILD layer 164 may be deposited by a PECVD process or other suitable deposition technique.

Figure 8A:
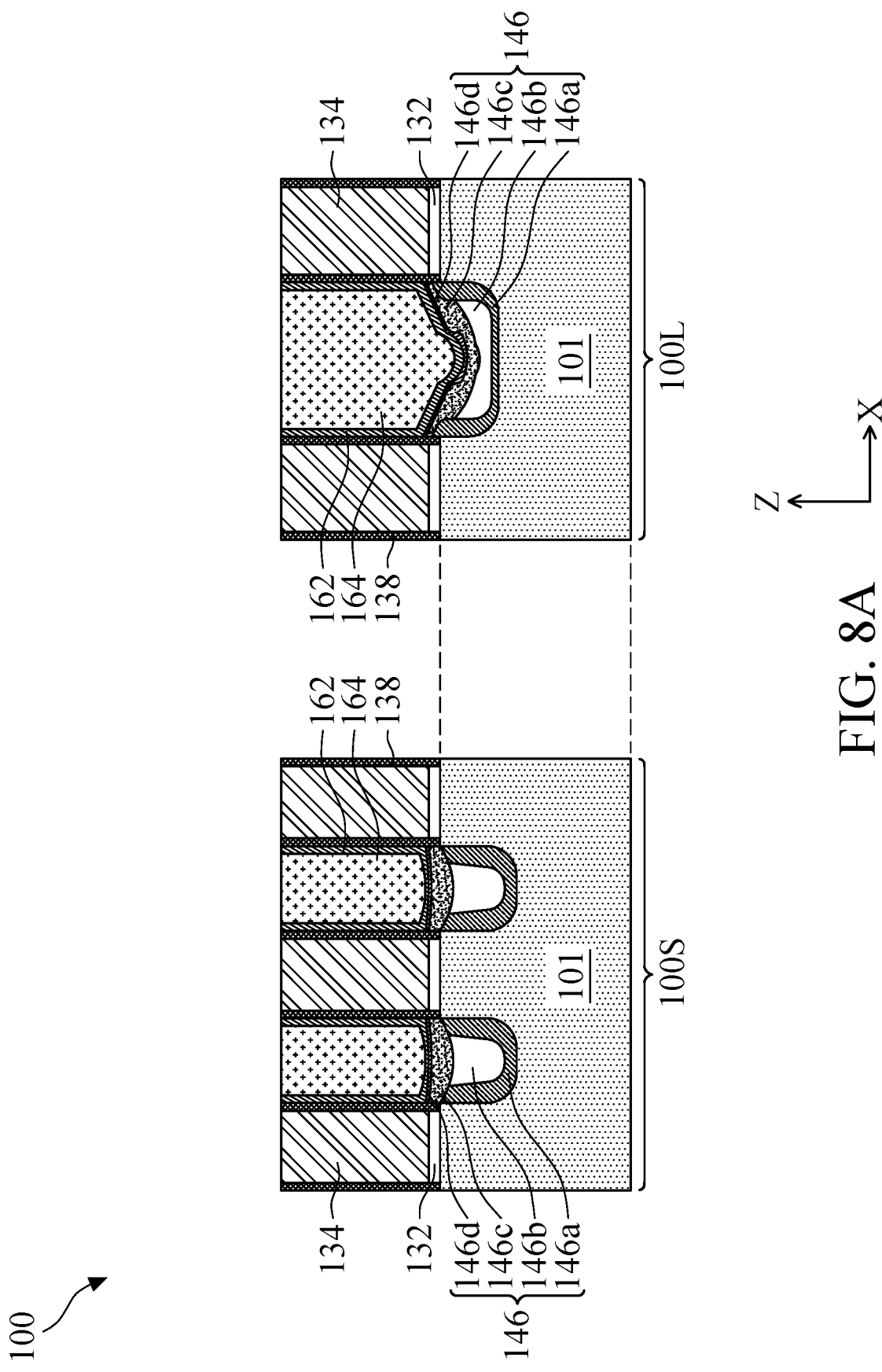
Figure 8B:
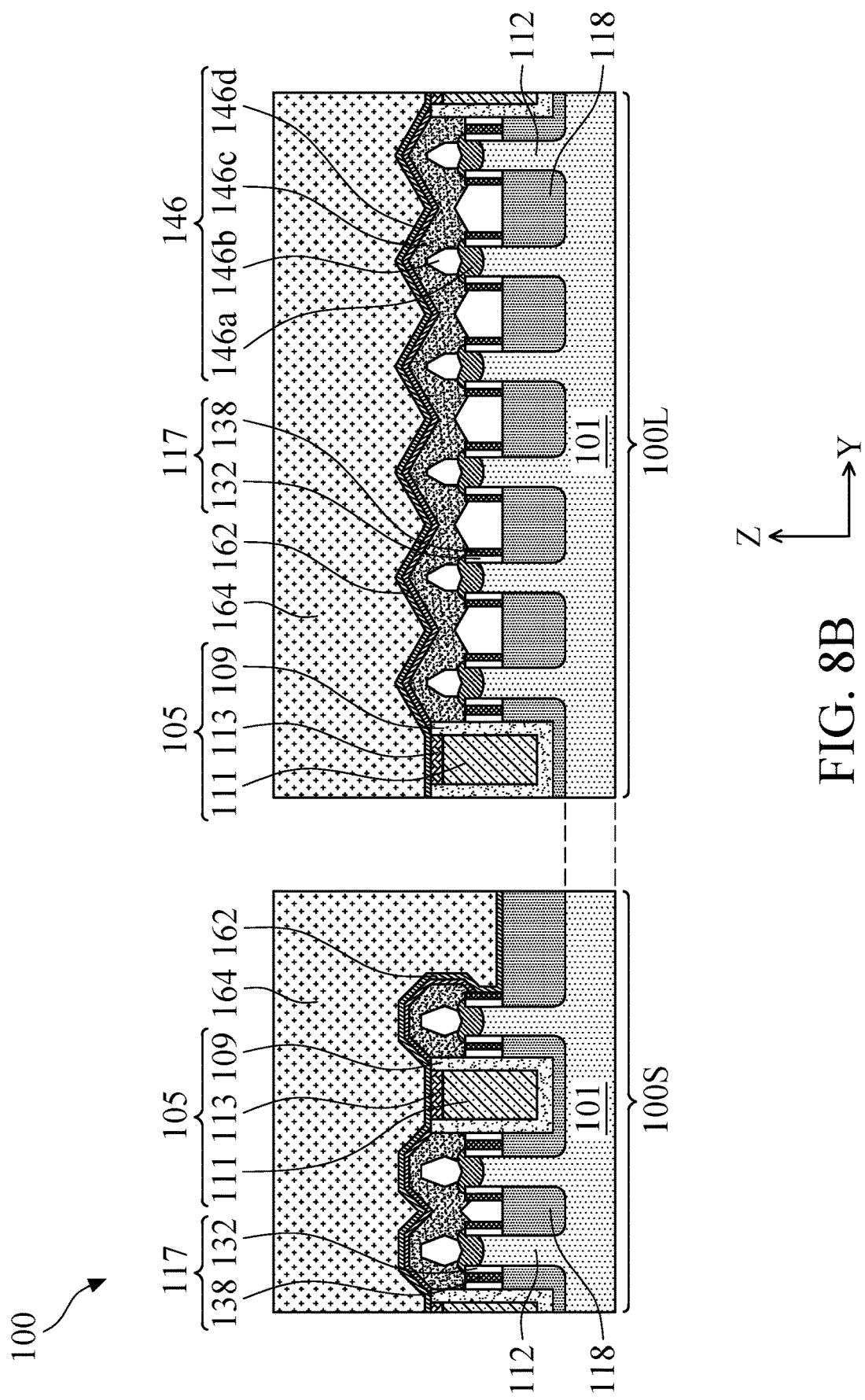

In FIGS. 8A and 8B, after the ILD layer 164 is formed, a planarization operation, such as CMP, is performed on the semiconductor device structure 100 until the top of the sacrificial gate electrode layer 134 is exposed.

Figure 9A:
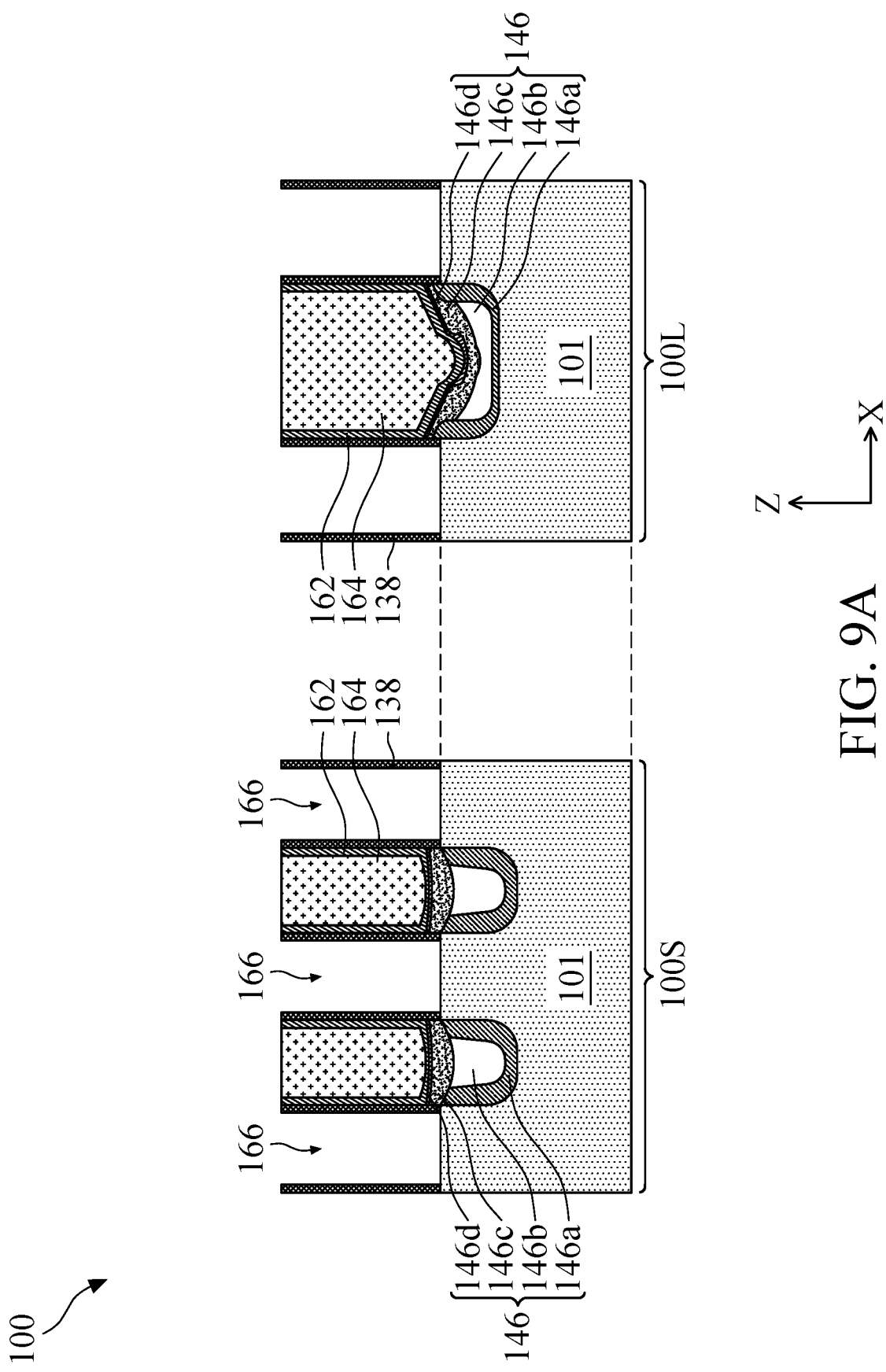
Figure 9B:
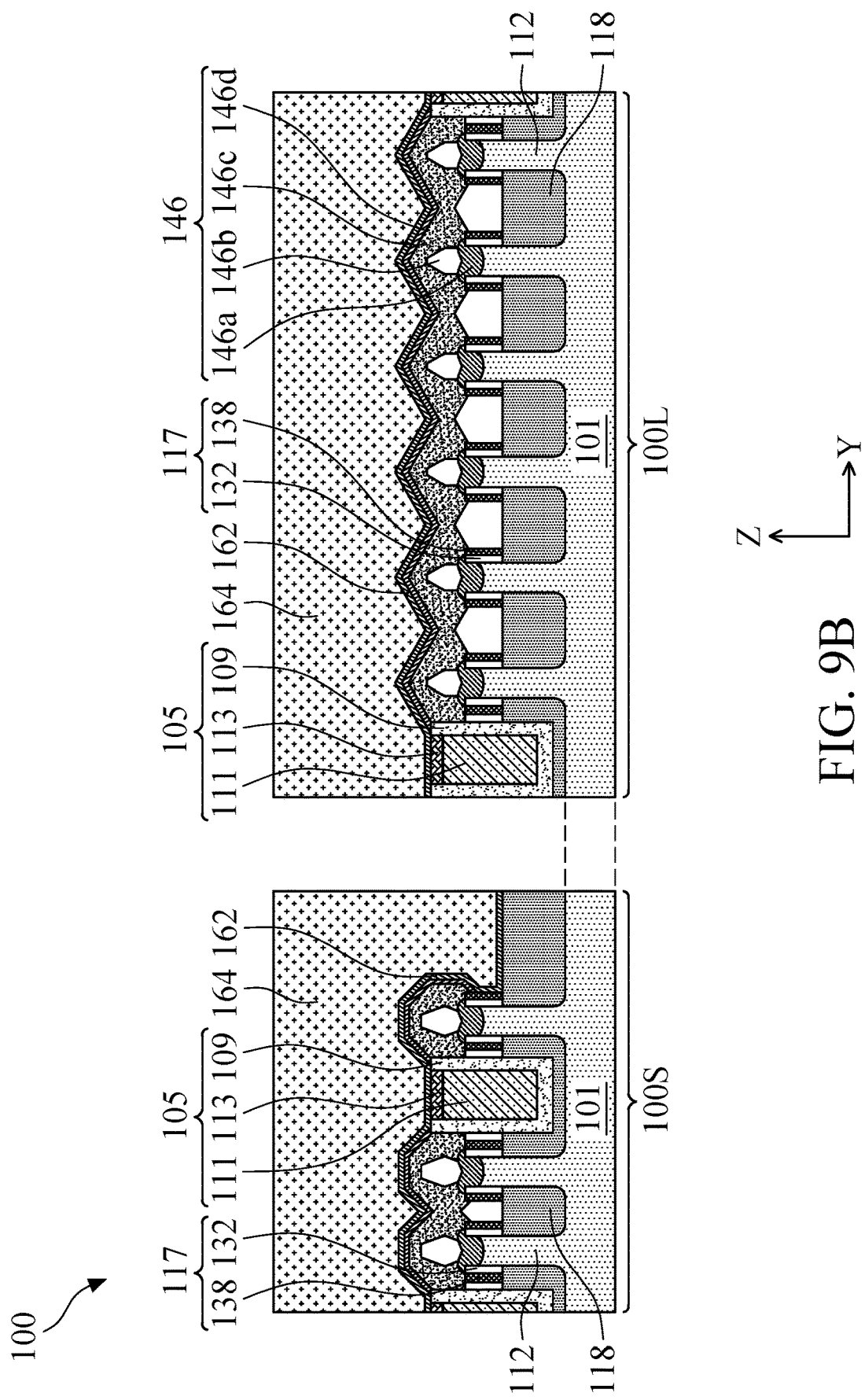

In FIGS. 9A and 9B, the sacrificial gate structures 130a, 130b in the short channel region 100S and the long channel region 100L are removed. The ILD layer 164 protects the epitaxial S/D features 146 during the removal of the sacrificial gate structures 130a, 130b. The sacrificial gate structures 130a, 130b can be removed using plasma dry etching and/or wet etching. For example, in cases where the sacrificial gate electrode layer 134 is polysilicon and the ILD layer 164 is silicon oxide, a wet etchant such as a tetramethylammonium hydroxide (TMAH) solution can be used to selectively remove the sacrificial gate electrode layer 134 without removing the dielectric materials of the ILD layer 164, the CESL 162, and the gate spacers 138. The sacrificial gate dielectric layer 132 is thereafter removed using plasma dry etching and/or wet etching. The removal of the sacrificial gate structures 130a, 130b forms a trench 166 in the regions where the sacrificial gate electrode layer 134 and the sacrificial gate dielectric layer 132 were removed. The trench 166 exposes a portion of the fins 112.

Figure 10A:
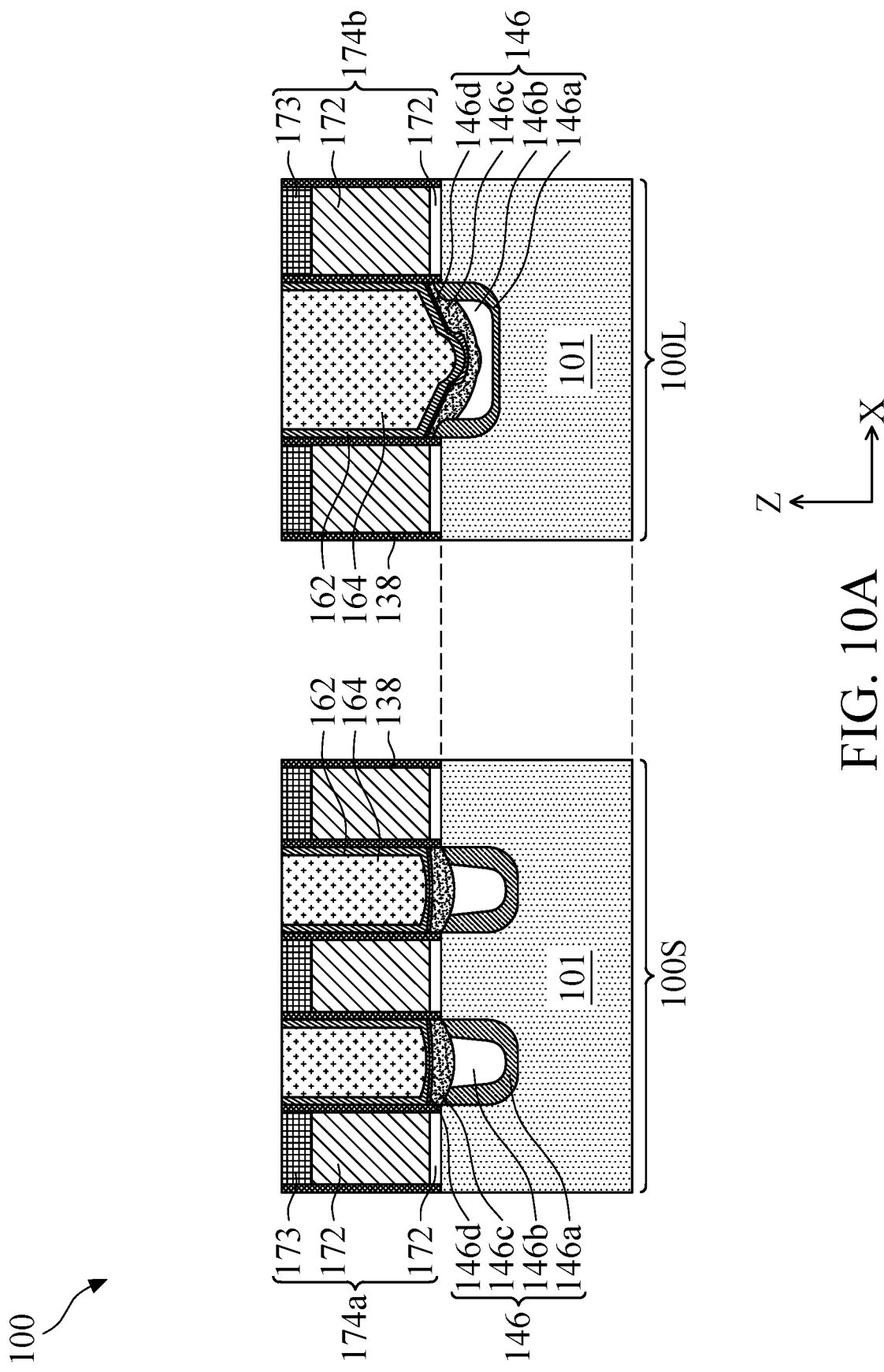
Figure 10B:
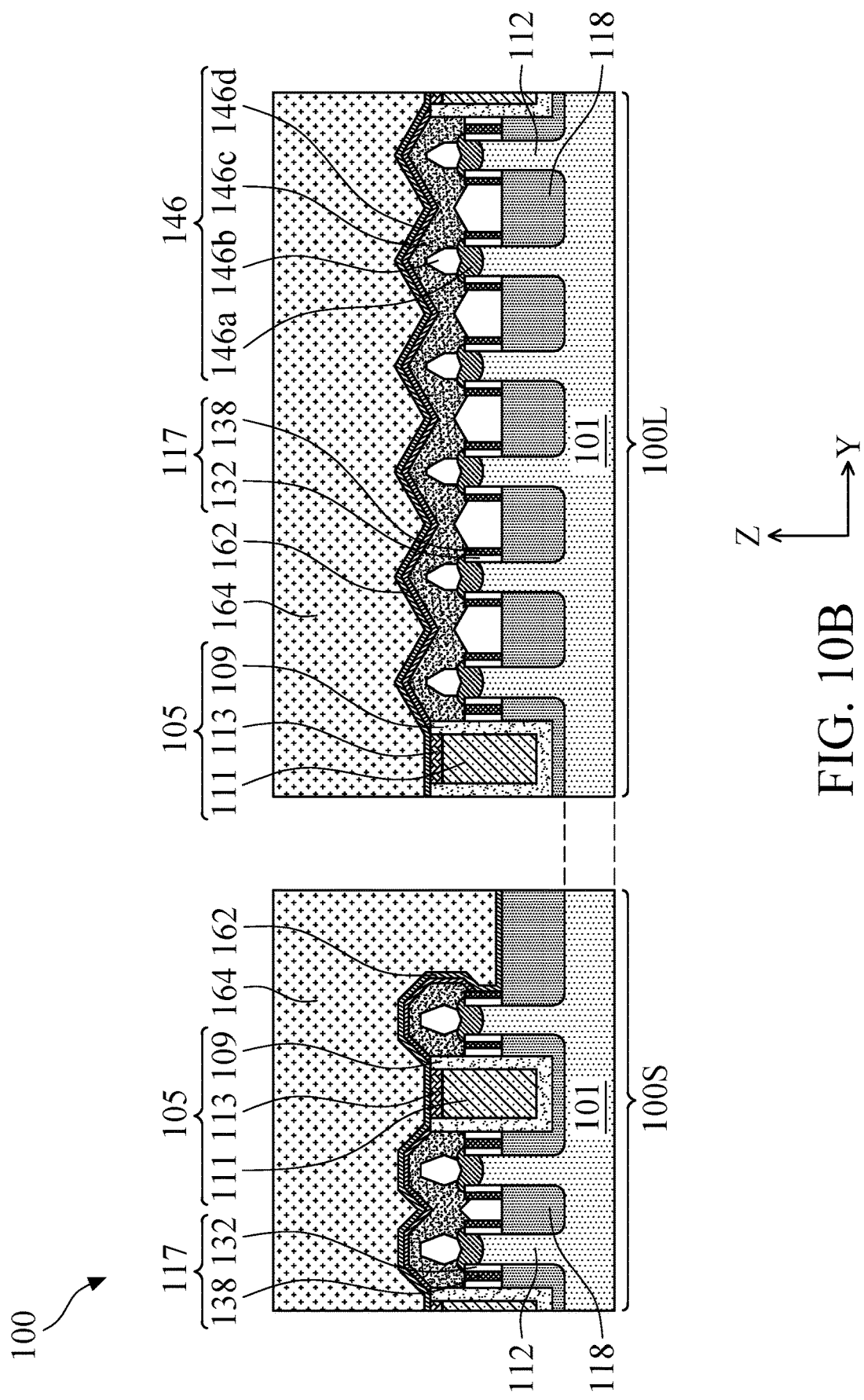

In FIGS. 10A and 10B, replacement gate structures 174a, 174b are formed within the trenches 166 (FIG. 9A) in the short channel and long channel regions 100S, 100L, respectively. The replacement gate structure 174a, 174b each includes a gate dielectric layer 170 formed on the exposed portion of the fins 112, a gate electrode layer 172 formed on the gate dielectric layer 170, and an optional cap layer 173 formed on the gate electrode layer 172. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include HfO2, HfSiO, HfSiON, HfTaO, HfSiO, HfZrO, zirconium oxide, aluminum oxide, titanium oxide, hafnium dioxide-alumina (HfO2-Al2O3) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electroplating, or other suitable deposition technique. The gate electrode layer 172 formed over the ILD layer 164 is then planarized by using, for example, CMP, until the top surface of the ILD layer 164 is exposed. After the planarization process, the gate electrode layer 172 is recessed by a metal gate etching back (MGEB) process, which may be a plasma etching process employing one or more etchants such as chlorine-containing gas, a bromine-containing gas, and/or a fluorine-containing gas. The cap layer 173 is then formed over the recessed gate electrode layer 172. The cap layer 173 may include one or more layers of a silicon nitride-based material, such as SiN. The cap layer 173 may be formed by CVD, PVD, ALD, or any suitable deposition technique. The cap layer 173 can be formed by depositing an insulating material followed by a planarization process.

Figure 11A:
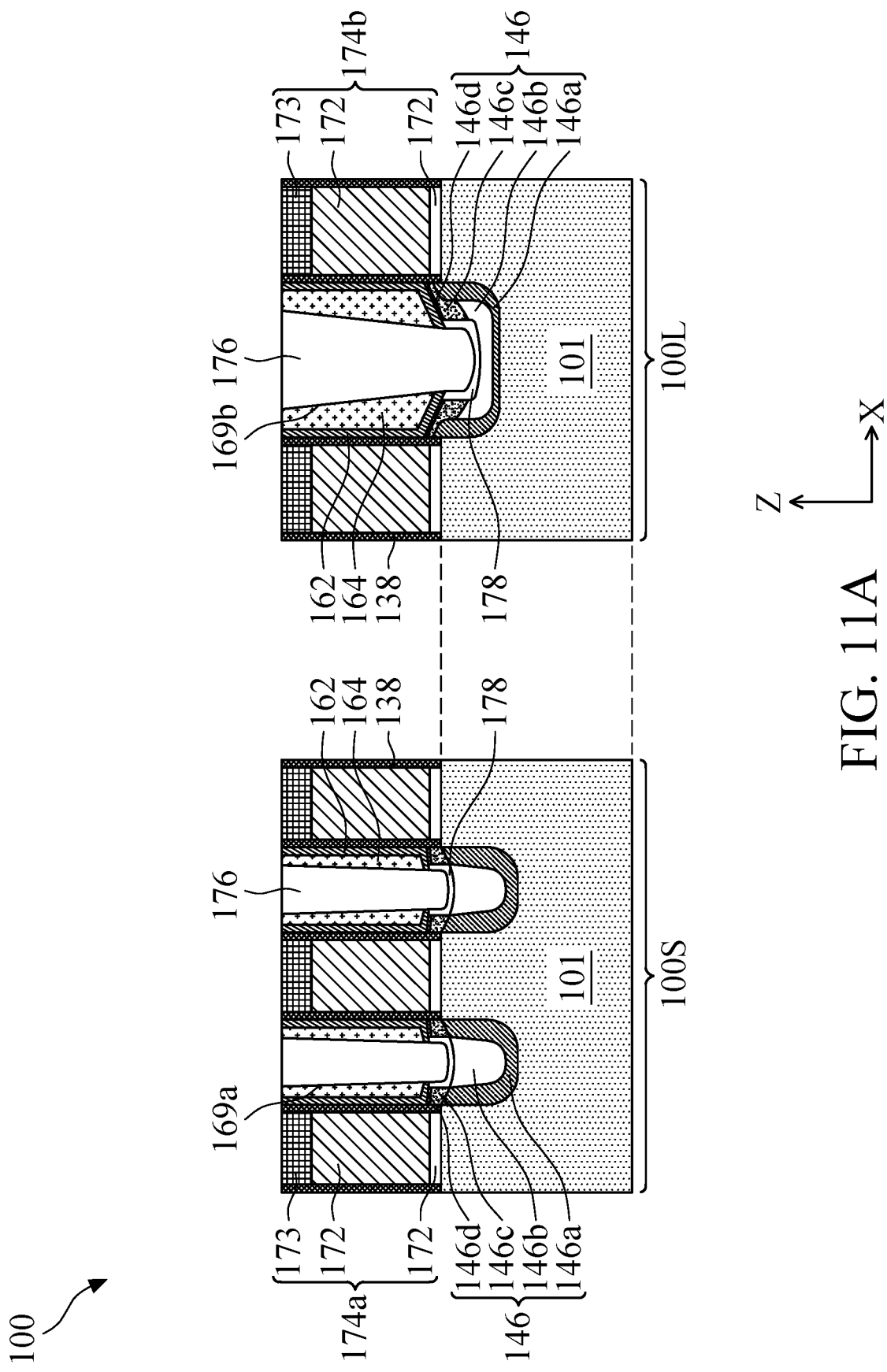
Figure 11B:
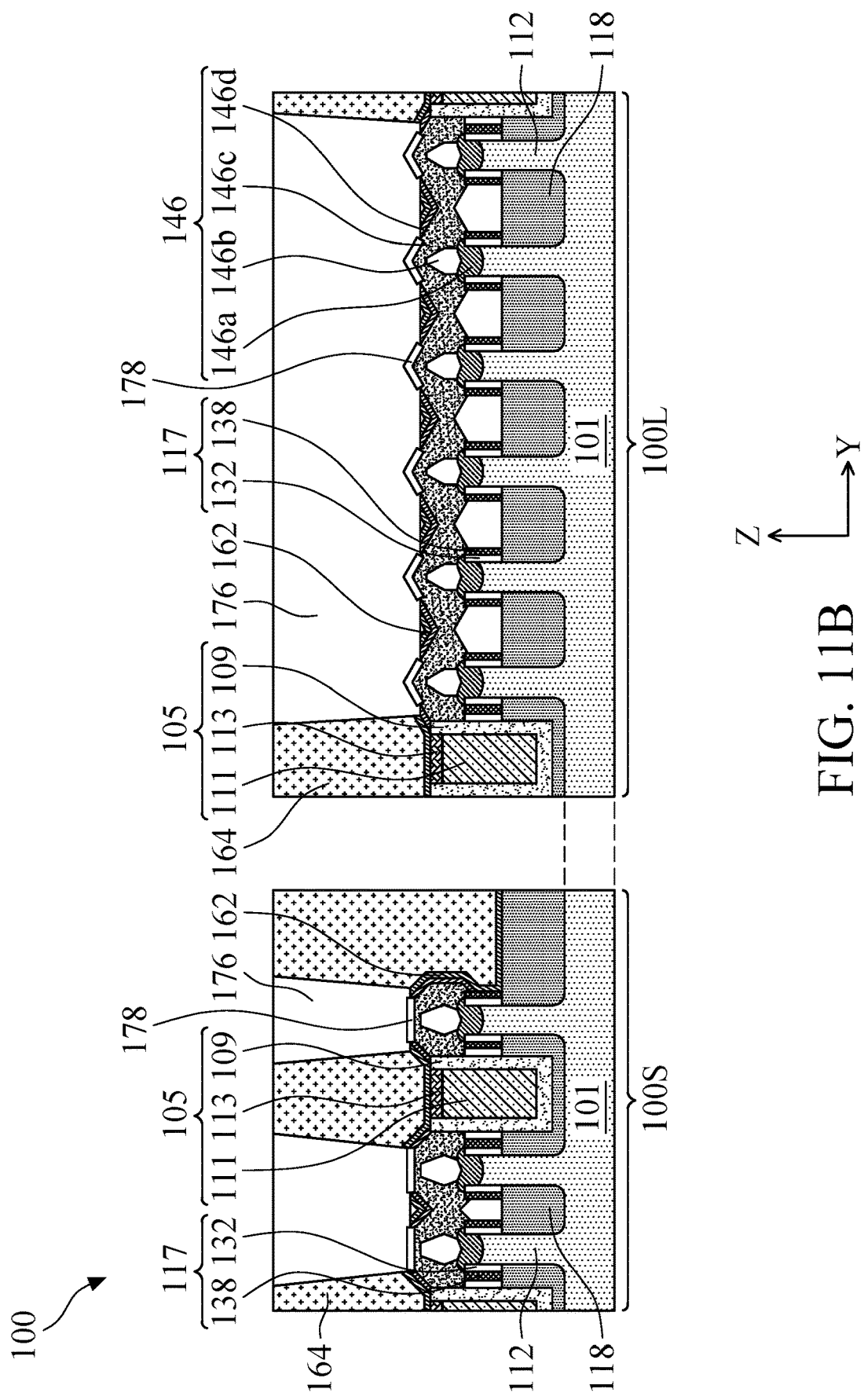

In FIGS. 11A and 11B, the S/D contacts 176 are formed in the ILD layer 164 in the short channel region 100S and the long channel region 100L, respectively. The S/D contacts 176 are formed by removing portions of the ILD layer 164 and the CESL layer 162, which forms contact openings 169a, 169b that expose the epitaxial S/D features 146. The portions of the ILD layer 164 and the CESL layer 162 are removed using suitable photolithographic and etching techniques. In some embodiments, the upper portions of the epitaxial S/D features 146 may also be etched. In such cases, the contact openings are further extended through the fourth epitaxial layer 146d and into a portion of the third epitaxial layer 146c. Depending on the process recipe used to remove the ILD layer 164 and the CESL layer 162, the etched surface of the epitaxial S/D features 146 may have a planar profile, or a non-planar profile, such as a concave profile (dishing), or a convex profile (protruded). In one embodiment shown in FIG. 11A, the etched surface of the third epitaxial layer 146c in the short channel region 100S and long channel region 100L has a concave profile, respectively.

After the formation of the contact openings, a silicide layer 178 is formed on the epitaxial S/D features 146 (e.g., the third epitaxial layer 146c) in the short channel region 100S and the long channel region 100L, respectively. The bottom of the silicide layer 178 may have a profile (e.g., a concave profile) in accordance with the etched profile of the upper portion of the epitaxial S/D features 146. The silicide layer 178 conductively couples the epitaxial S/D features 146 to the subsequently formed S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 (e.g., the third epitaxial layer 146c) to form the silicide layer 178. Unreacted portion of the metal source layer is then removed. For n-channel FETs, the silicide layer 178 may be made of a material including one or more of TiSi, CrSi, TaSi, MoSi, ZrSi, HfSi, ScSi, Ysi, HoSi, TbSI, GdSi, LuSi, Dy Si, ErSi, YbSi, or combinations thereof. For p-channel FETs, the silicide layer 178 may be made of a material including one or more of NiSi, CoSi, MnSi, Wsi, FeSi, RhSi, PdSi, RuSi, PtSi, IrSi, OsSi, or combinations thereof. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the S/D contacts 176. The conductive material may be made of a material including one or more of Ru, Mo, Co, Ni. W, Ti, Ta, Cu, Al, TiN and TaN, and can be formed by CVD, ALD, electro-plating, or other suitable deposition technique. While not shown, a barrier layer (e.g., TiN, TaN, or the like) may be formed on sidewalls of the contact openings prior to forming the S/D contacts 176.

Figures 12A, 12B:
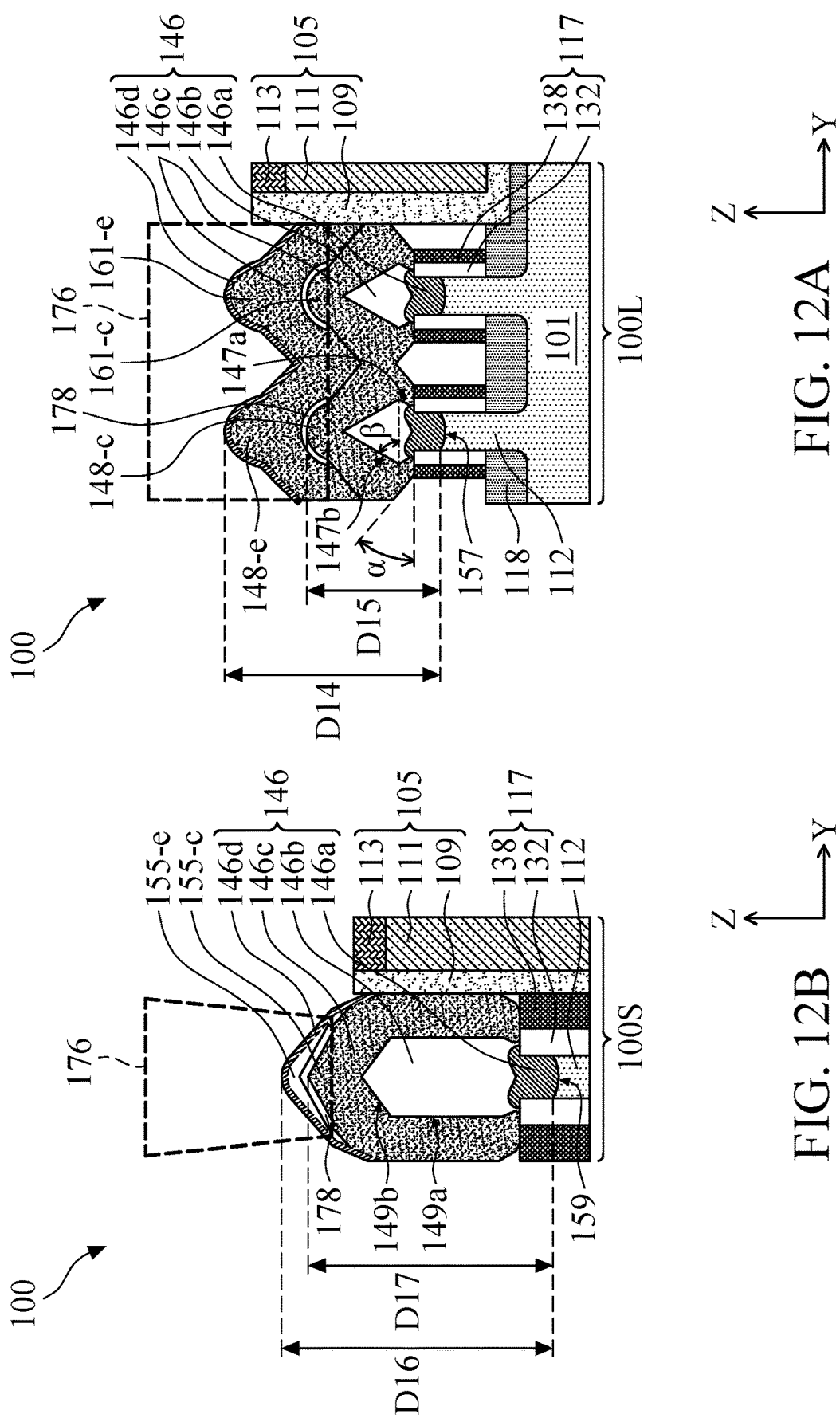
FIGS. 12A and 12B illustrate a portion of the semiconductor device structure in accordance with some embodiments.

As discussed above, due to controlled growth rates of different planes during the formation of the second epitaxial layer 146b, the final raise height of the epitaxial S/D features 146 in the long channel region 100L is increased. The increase of the final raise height of the epitaxial S/D features 146 allows the S/D contact 176 to cover more surface area of the epitaxial S/D features 146. FIGS. 12A and 12B illustrate a portion of the semiconductor device structure 100 showing the etched epitaxial S/D features 146 in the short channel and long channel regions 100S, 100L, respectively, in accordance with some embodiments. In FIGS. 12A and 12B, the S/D contacts 176 are shown in dotted lines and the CESL 162 has been omitted for ease of illustration. As can be seen in FIG. 12A, the final height of the epitaxial S/D features 146 in the long channel region 100L, which corresponds to a distance D14 measuring from the top of the fourth epitaxial layer 146d to the top surface of the fin 112, is about 30 nm to about 100 nm. The final raise height of the epitaxial S/D features 146 in the long channel region 100L, which corresponds to a distance D15 measuring from the center (or valley) portion 148-c of the third epitaxial layer 146c to an interface 157 between the top of the fin 112 and the bottom of the first epitaxial layer 146a, is about 10 nm to about 80 nm. In addition, the entire edge (or ridge) portions 148-e of the third epitaxial layer 146c of each epitaxial S/D feature 146 in the long channel region 100L are fully embedded or covered by the S/D contact 176, and the center (or valley) portions 148-c of the third epitaxial layer 146c of each epitaxial S/D feature 146 in the long channel regions 100L are partially embedded or covered by the S/D contact 176. In some embodiments, at least 30%, for example about 35% to about 60%, of the surface area of the center portions 148-c of the third epitaxial layer 146c of each epitaxial S/D features 146 in the long channel regions 100L the S/D contact 176 is embedded or covered by the S/D contact 176. FIG. 12A further shows that the facet 147b of the second epitaxial layer 146b has an internal angle of about 54.7° with respect to a plane substantially parallel to a top surface 118a of the insulating material 118. The facet 147a has an external angle β of about 54.7° with respect to the top surface 118a of the insulating material 118.

In FIG. 12B, the final height of the epitaxial S/D features 146 in the short channel region 100S, which corresponds to a distance D16 measuring from the top of the fourth epitaxial layer 146d to the top surface of the fin 112, is about 40 nm to about 120 nm. The final raise height of the epitaxial S/D features 146 in the short channel region 100L, which corresponds to a distance D17 measuring from the center (or valley) portion 155-c of the third epitaxial layer 146c to an interface 159 between the top of the fin 112 and the bottom of the first epitaxial layer 146a, is about 20 nm to about 100 nm. In some embodiments, the distance D17 is greater than the distance D15. In addition, the edge portion 155-e of the third epitaxial layer 146c of the epitaxial S/D feature 146 in the short channel region 100S is fully embedded or covered by the S/D contact 176, and the center portion 155-c of the third epitaxial layer 146c of the epitaxial S/D feature 146 is partially embedded or covered by the S/D contact 176.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the gate electrode layers 172 may be connected to a frontside power source.

Various embodiments of the present disclosure propose improved processes to increase a final raise height epitaxial S/D feature in the long channel (or I/O) regions. In some cases, the raise height of the epitaxial S/D feature 146 in the long channel regions 100L can be increased by at least 5 nm to about 10 nm without affecting critical dimension uniformity of the fins 112, the epitaxial S/D feature 146, and fin sidewalls 117 in the short channel (or core circuit) regions 100S. The increased raise height of the epitaxial S/D feature 146 in the long channel regions 100L may be achieved through the epitaxy processes used to form at least a portion (e.g., second epitaxial layer 146b) of the epitaxial S/D features 146 so that growth rate on surfaces having (100) surface orientation is higher than the growth rate on surfaces having (110) and (111) surface orientations. Due to different growth rates on different surface planes and different gate spacing in the short channel and long channel regions, the epitaxial S/D features in the short channel regions or core circuit regions are formed in a substantial bar-like shape while the epitaxial S/D features in the long channel regions are formed in a substantial diamond-like shape. The diamond-like shape of the epitaxial S/D features in the long channel regions or I/O regions provides an increased raise height, which in turn increases the surface area of the epitaxial S/D features for a subsequent S/D metal contact. As a result, the contact resistance of epitaxial S/D features in the long channel regions or I/O regions is reduced and the device performance of the transistors is improved.

An embodiment is a semiconductor device structure. The structure includes a substrate having a plurality of fins formed from the substrate, a first source/drain feature comprising a first epitaxial layer in contact with a first fin of the plurality of fins, a second epitaxial layer formed on the first epitaxial layer, a third epitaxial layer formed on the second epitaxial layer, the third epitaxial layer comprising a center portion and an edge portion that is higher than the center portion, and a fourth epitaxial layer formed on the third epitaxial layer, a second source/drain feature disposed adjacent to the first source/drain feature, the second source/drain feature comprising a first epitaxial layer in contact with a second fin of the plurality of fins, a second epitaxial layer formed on the first epitaxial layer of the second source/drain feature, a third epitaxial layer formed on the second epitaxial layer of the second source/drain feature, the third epitaxial layer comprising a center portion and an edge portion that is higher than the center portion of the third epitaxial layer, wherein the center portion and the edge portion of the third epitaxial layer of the second source/drain feature are in contact with the center portion and edge portion of the third epitaxial layer of the first source/drain feature, respectively, and a fourth epitaxial layer formed on the third epitaxial layer of the second source/drain feature, a source/drain contact covering the entire edge portions of the third epitaxial layers of the first and second source/drain features, and the source/drain contact covering a portion of the center portions of the third epitaxial layers of the first and second source/drain features.

Another embodiment is a semiconductor device structure. The structure includes a substrate, a first gate structure disposed in a first region of the substrate, a second gate structure disposed adjacent the first gate structure in the first region, wherein the second gate structure is separated from the first gate structure by a first lateral separation distance. The structure includes a first source/drain feature disposed between the first gate structure and the second gate structure, wherein the first source/drain feature comprises a first epitaxial layer having a substantial diamond-like shape, and a second epitaxial layer in contact with the first epitaxial layer, the second epitaxial layer comprising a first center portion and a first edge portion that is higher than the first center portion. The structure also includes a second source/drain feature disposed between the first gate structure and the second gate structure, wherein the second source/drain feature comprises a first epitaxial layer having a substantial diamond-like shape, and a second epitaxial layer in contact with the first epitaxial layer of the second source/drain feature, the second epitaxial layer comprising a second center portion and a second edge portion that is higher than the second center portion, a third gate structure disposed in a second region of the substrate, a fourth gate structure disposed adjacent the third gate structure in the second region, wherein the fourth gate structure is separated from the third gate structure by a second lateral separation distance less than the first lateral separation distance. The structure further includes a third source/drain feature disposed between the third gate structure and the fourth gate structure, wherein the third source/drain feature comprises a first epitaxial layer having a substantial bar-like shape.

A further embodiment is a method for forming a semiconductor device structure. The method includes forming a plurality of fins from a substrate, forming a first gate structure and a second gate structure in a first region of the substrate, wherein the second gate structure is separated from the first gate structure by a first lateral separation distance. The method includes forming a third gate structure and fourth gate structure in a second region of the substrate, wherein the fourth gate structure is separated from the third gate structure by a second lateral separation distance less than the first lateral separation distance. The method includes forming a first source/drain feature between the first and second gate structures, comprising forming a first epitaxial layer on a first fin of the plurality of fins, forming a second epitaxial layer on the first epitaxial layer, wherein the formation of the second epitaxial layer is controlled so that growth rate on surface planes having (100) surface orientation is higher than growth rates on surface planes having (110) and (111) surface orientations, and forming a third epitaxial layer on the second epitaxial layer. The method includes forming a second source/drain feature between the third and fourth gate structures, comprising forming a first epitaxial layer on a second fin of the plurality of fins, forming a second epitaxial layer on the first epitaxial layer of the second source/drain feature, and forming a third epitaxial layer on the second epitaxial layer. The method includes forming a contact etch stop layer over the third epitaxial layer of the first and second source/drain features and on exposed surfaces of the first, second, third, and fourth gate structures. The method includes forming an interlayer dielectric on the contact etch stop layer. The method includes forming an opening through the interlayer dielectric and the contact etch stop layer, the opening exposing at least a portion of the third epitaxial layer of the first and second source/drain features. The method further includes forming a source/drain contact in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a substrate having a plurality of fins formed from the substrate;
   a first source/drain feature comprising:
   a first epitaxial layer in contact with a first fin of the plurality of fins;
   a second epitaxial layer formed on the first epitaxial layer;
   a third epitaxial layer formed on the second epitaxial layer, the third epitaxial layer comprising a center portion and an edge portion that is higher than the center portion; and
   a fourth epitaxial layer formed on the third epitaxial layer;
   a second source/drain feature disposed adjacent to the first source/drain feature, the second source/drain feature comprising:
   a first epitaxial layer in contact with a second fin of the plurality of fins;
   a second epitaxial layer formed on the first epitaxial layer of the second source/drain feature;
   a third epitaxial layer formed on the second epitaxial layer of the second source/drain feature, the third epitaxial layer comprising a center portion and an edge portion that is higher than the center portion of the third epitaxial layer, wherein the center portion and the edge portion of the third epitaxial layer of the second source/drain feature are in contact with the center portion and edge portion of the third epitaxial layer of the first source/drain feature, respectively; and
   a fourth epitaxial layer formed on the third epitaxial layer of the second source/drain feature; and
   a source/drain contact covering the entire edge portions of the third epitaxial layers of the first and second source/drain features, and the source/drain contact covering a portion of the center portions of the third epitaxial layers of the first and second source/drain features.

2. The semiconductor device structure of claim 1, wherein the first and second source/drain features are in an input/output (I/O) circuit region of the substrate.

3. The semiconductor device structure of claim 1, wherein the second epitaxial layer of the first and second source/drain features has a substantial diamond-like shape with respect to a cross-sectional view of semiconductor device structure.

4. The semiconductor device structure of claim 1, further comprising:
   a gate structure comprising:
   a gate dielectric layer in contact with the first and second fins; and
   a gate electrode layer disposed over the gate dielectric layer; and
   a gate spacer formed on sidewalls of the gate structure and in contact with the gate dielectric layer, the gate electrode layer, and the third epitaxial layer of the first and second source/drain features.

5. The semiconductor device structure of claim 4, wherein the first epitaxial layer has a first depth corresponding to a distance measuring from an interface between a bottom of the gate dielectric layer and the first fin to a bottom of the first epitaxial layer, and the second epitaxial layer has a second depth corresponding to a distance measuring from the interface to a bottom of the second epitaxial layer, and wherein the first depth is greater than the second depth.

6. The semiconductor device structure of claim 1, wherein the first epitaxial layer of the first and second source/drain features has a first dopant concentration, the second epitaxial layer of the first and second source/drain features has a second dopant concentration higher than the first dopant concentration, the third epitaxial layer of the first and second source/drain features has a third dopant concentration higher than the second dopant concentration, and the fourth epitaxial layer of the first and second source/drain features has a fourth dopant concentration higher than the third dopant concentration.

7. The semiconductor device structure of claim 1, further comprising:
   a first gate spacer disposed adjacent to the first fin and in contact with the center portion of the third epitaxial layer of the first source/drain feature; and
   a first gate dielectric layer disposed between and in contact with the first gate spacer and the first fin, wherein the first gate dielectric layer is in contact with the center portion of the third epitaxial layer of the first source/drain feature.

8. The semiconductor device structure of claim 1, further comprising:
   a first silicide layer disposed between and in contact with the source/drain contact and the center portion of the third epitaxial layer of the first source/drain feature; and
   a second silicide layer disposed between and in contact with the source/drain contact and the center portion of the third epitaxial layer of the second source/drain feature.

9. A semiconductor device structure, comprising:
   a substrate;
   a first gate structure disposed in a first region of the substrate;
   a second gate structure disposed adjacent the first gate structure in the first region, wherein the second gate structure is separated from the first gate structure by a first lateral separation distance;
   a first source/drain feature disposed between the first gate structure and the second gate structure, wherein the first source/drain feature comprises:
      a first epitaxial layer having a substantial diamond-like shape; and
      a second epitaxial layer in contact with the first epitaxial layer, the second epitaxial layer comprising a first center portion and a first edge portion that is higher than the first center portion;
   a second source/drain feature disposed between the first gate structure and the second gate structure, wherein the second source/drain feature comprises:
      a first epitaxial layer having a substantial diamond-like shape; and
      a second epitaxial layer in contact with the first epitaxial layer of the second source/drain feature, the second epitaxial layer comprising a second center portion and
   a second edge portion that is higher than the second center portion;
   a third gate structure disposed in a second region of the substrate;
   a fourth gate structure disposed adjacent the third gate structure in the second region, wherein the fourth gate structure is separated from the third gate structure by a second lateral separation distance less than the first lateral separation distance; and
   a third source/drain feature disposed between the third gate structure and the fourth gate structure, wherein the third source/drain feature comprises a first epitaxial layer having a substantial bar-like shape.

10. The semiconductor device structure of claim 9, wherein the first region is an input/output (I/O) circuit region of the substrate and the second region is a core circuit region of the substrate.

11. The semiconductor device structure of claim 9, wherein the first and second gate structures each has a first gate length, and the third and fourth gate structures each has a second gate length, and the first gate length is greater than the second gate length.

12. The semiconductor device structure of claim 9, further comprising:
   a first gate spacer in contact with the first center portion; and
   a first gate dielectric layer in contact with the first gate spacer and the first center portion.

13. The semiconductor device structure of claim 12, further comprising:
   a second gate spacer in contact with the second center portion; and
   a second gate dielectric layer in contact with the second gate spacer and the second center portion.

14. The semiconductor device structure of claim 13, wherein the third source/drain feature further comprises:
   a second epitaxial layer in contact with the first epitaxial layer of the third source/drain feature, and the second epitaxial layer comprises:
      a third center portion; and
      a third edge portion that is higher than the third center portion.

15. The semiconductor device structure of claim 14, wherein the first and second source/drain features each has a first raise height measuring from a top of the first and second center portions to a bottom of the first and second source/drain features, respectively, and the third source/drain feature has a second raise height measuring from a top of the third center portion to a bottom of the third source/drain feature, and the second raise height is greater than the first raise height.

16. The semiconductor device structure of claim 15, further comprising:
   a source/drain contact disposed over first, second, and third source/drain features.

17. The semiconductor device structure of claim 16, further comprising:
   a first silicide layer disposed between and in contact with the source/drain contact and the first center portion;
   a second silicide layer disposed between and in contact with the source/drain contact and the second center portion; and
   a third silicide layer disposed between and in contact with the source/drain contact and the third center portion.

18. A method for forming a semiconductor device structure, comprising:
   forming a plurality of fins from a substrate;
   forming a first gate structure and a second gate structure in a first region of the substrate, wherein the second gate structure is separated from the first gate structure by a first lateral separation distance;
   forming a third gate structure and fourth gate structure in a second region of the substrate, wherein the fourth gate structure is separated from the third gate structure by a second lateral separation distance less than the first lateral separation distance;
   forming a first source/drain feature between the first and second gate structures, comprising:
      forming a first epitaxial layer on a first fin of the plurality of fins;
      forming a second epitaxial layer on the first epitaxial layer, wherein the formation of the second epitaxial layer is controlled so that growth rate on surface planes having (100) surface orientation is higher than growth rates on surface planes having (110) and (111) surface orientations; and
      forming a third epitaxial layer on the second epitaxial layer;
   forming a second source/drain feature between the third and fourth gate structures, comprising:
      forming a first epitaxial layer on a second fin of the plurality of fins;
      forming a second epitaxial layer on the first epitaxial layer of the second source/drain feature; and forming a third epitaxial layer on the second epitaxial layer;

forming a contact etch stop layer over the third epitaxial layer of the first and second source/drain features and on exposed surfaces of the first, second, third, and fourth gate structures;

forming an interlayer dielectric on the contact etch stop layer;

forming an opening through the interlayer dielectric and the contact etch stop layer, the opening exposing at least a portion of the third epitaxial layer of the first and second source/drain features; and forming a source/drain contact in the opening.

19. The method of claim 18, wherein the growth rates of (100), (110), (111) surface planes is in a ratio (100):(110):(111) of about 0.8:0.2:0.2 to about 3.5:0.35:0.35.

20. The method of claim 19, wherein the second epitaxial layer of the first source/drain feature has a substantial diamond-like shape and the second epitaxial layer of the second source/drain feature has a substantial bar-like shape.

* * * * *